(12) United States Patent  
Strukov et al.

(10) Patent No.: US 8,390,323 B2
(45) Date of Patent: Mar. 5, 2013

(54) DENSE NANOSCALE LOGIC CIRCUITRY

(75) Inventors: Dmitri Borisovich Strukov, Menlo Park, CA (US); Philip J. Kuekes, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/256,234

(22) PCT Filed: Apr. 30, 2009

(86) PCT No.: PCT/US2009/002680
§ 371 (c)(1),
(2), (4) Date: Sep. 13, 2011

(87) PCT Pub. No.: WO2010/126468
PCT Pub. Date: Nov. 4, 2010

(65) Prior Publication Data
US 2012/0001653 A1      Jan. 5, 2012

(51) Int. Cl.
*H03K 19/177* (2006.01)
(52) U.S. Cl. ............................................ 326/38; 326/41
(58) Field of Classification Search ............... 326/37–41
See application file for complete search history.

(56) References Cited

U.S. PATENT DOCUMENTS

| 5,400,262 | A | 3/1995 | Mohsen | |
|---|---|---|---|---|
| 2003/0200521 | A1 | 10/2003 | DeHon | |
| 2004/0113138 | A1 | 6/2004 | DeHon | |
| 2005/0017234 | A1 | 1/2005 | DeHon | |
| 2005/0218397 | A1* | 10/2005 | Tran | 257/14 |
| 2006/0161876 | A1 | 7/2006 | DeHon | |
| 2006/0214683 | A1* | 9/2006 | DeHon | 326/41 |
| 2007/0229121 | A1* | 10/2007 | Mouttet | 327/100 |
| 2011/0233676 | A1* | 9/2011 | Or-Bach et al. | 257/347 |
| 2012/0098566 | A1* | 4/2012 | Robinett | 326/38 |

* cited by examiner

*Primary Examiner* — Don Le

(57) ABSTRACT

One embodiment of the present invention is directed to hybrid-nanoscale/microscale device comprising a microscale layer that includes microscale and/or submicroscale circuit components and that provides an array of microscale or submicroscale pins across an interface surface; and at least two nanoscale-layer sub-layers within a nanoscale layer that interfaces to the microscale layer, each nanoscale-layer sub-layer containing regularly spaced, parallel nanowires, each nanowire of the at least two nanoscale-layer sub-layers in electrical contact with at most one pin provided by the microscale layer, the parallel nanowires of successive nanoscale-layer sub-layers having different directions, with the nanowires of successive nanoscale-layer sub-layers intersecting to form programmable crosspoints.

15 Claims, 28 Drawing Sheets

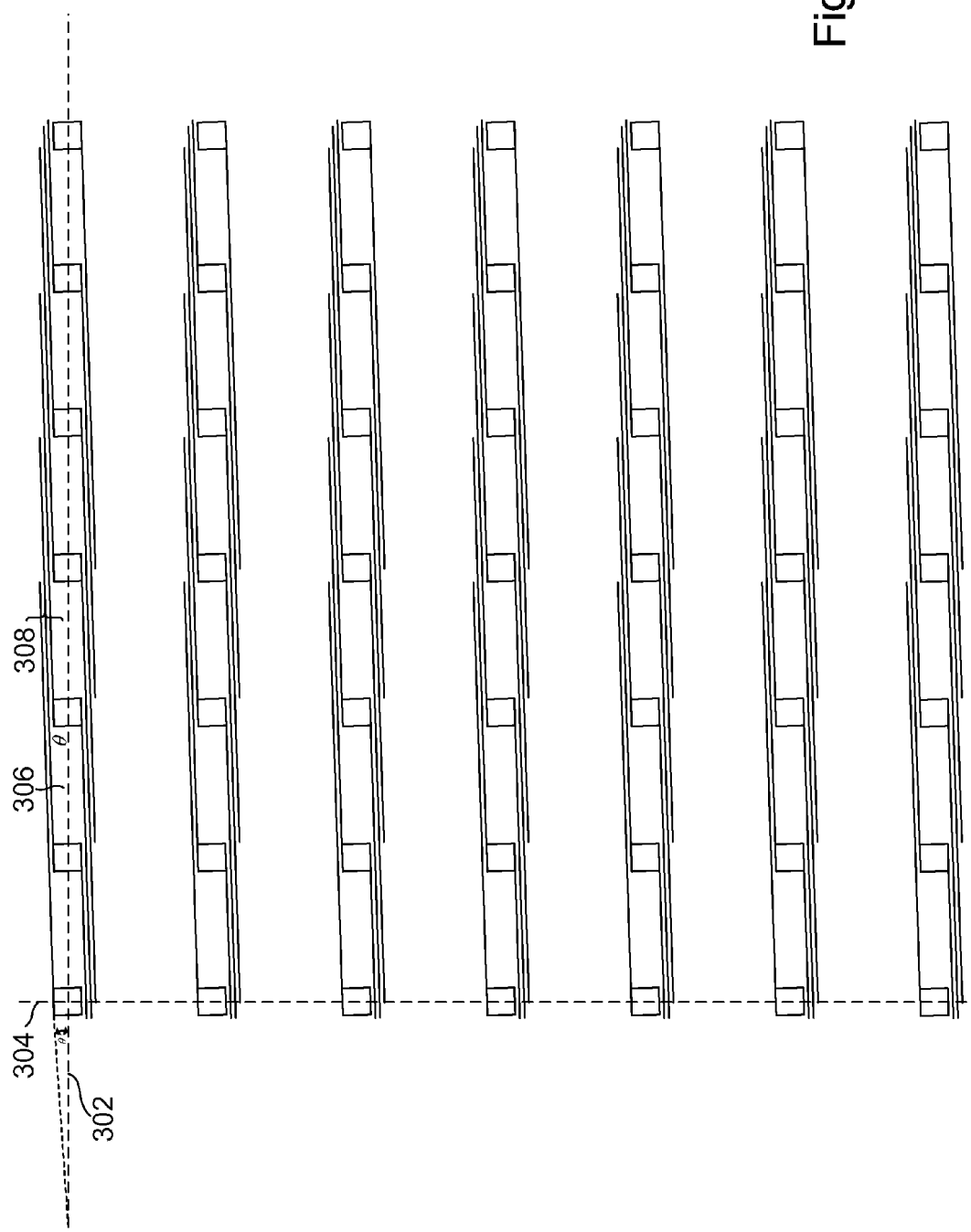

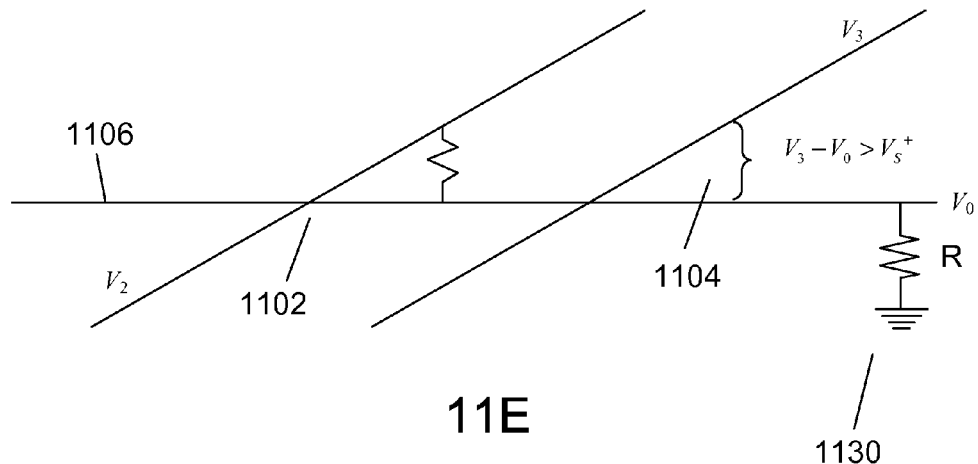
11E
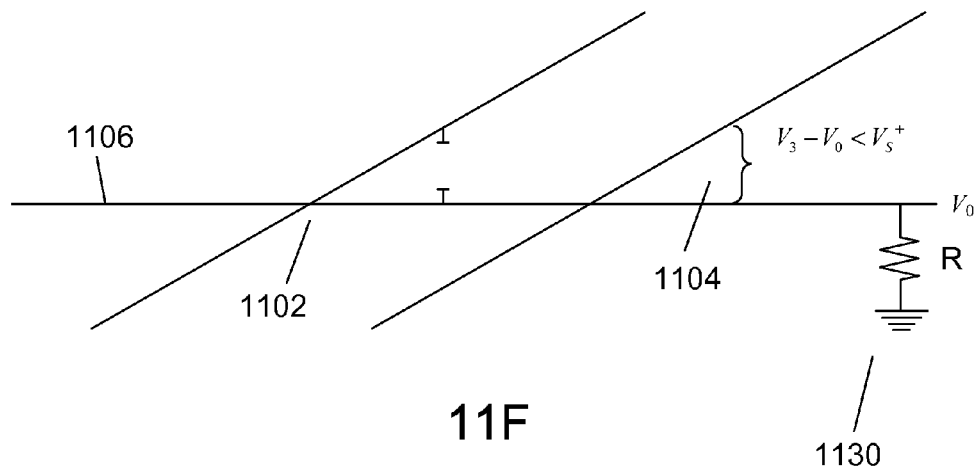
11F

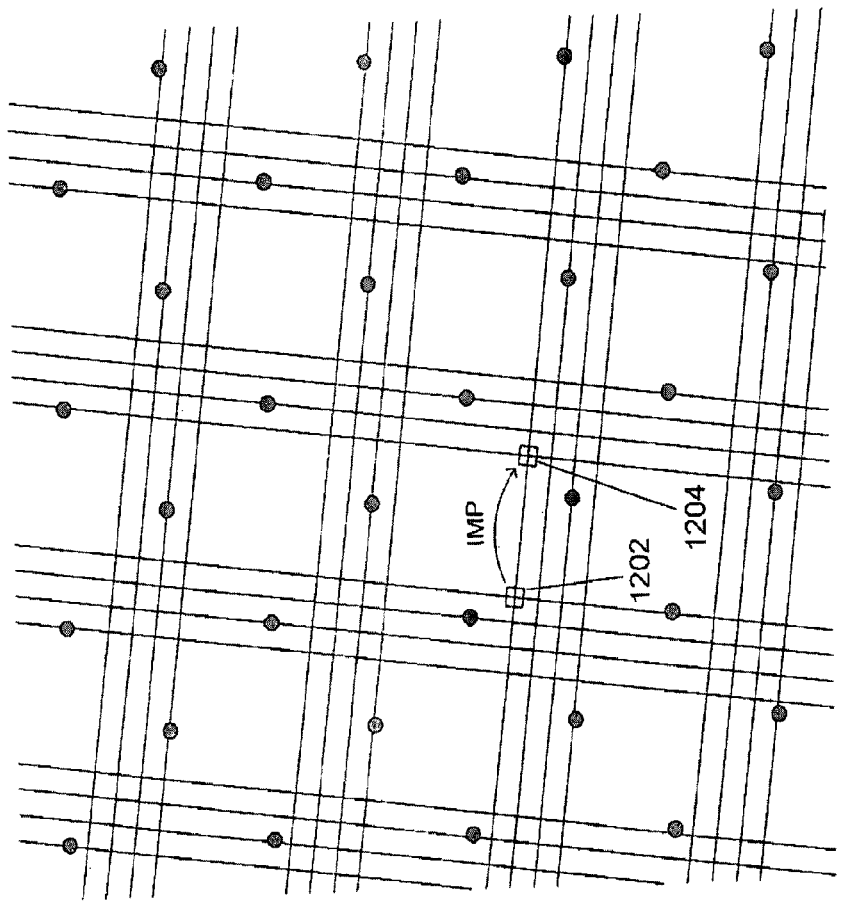

DENSE NANOSCALE LOGIC CIRCUITRY

TECHNICAL FIELD

The present invention is related to integrated circuits and other electronic devices and, in particular, to dense nanoscale circuitry that can be used for general computing within a hybrid nanoscale/microscale or nanoscale/submicroscale device.

BACKGROUND OF THE INVENTION

As manufacturers and designers of integrated circuits relentlessly continue to decrease the size of integrated-circuit features, such as transistors and signal lines, and to correspondingly increase the density at which features can be fabricated within integrated circuits, they are beginning to approach fundamental physical limits to further decreases in feature sizes for integrated circuits fabricated by conventional photolithography techniques. Research efforts have, during the past decade, turned to new device technologies that provide for significantly smaller features than the smallest features currently fabricated by photolithographic techniques. An exemplary new device technology is the programmable crosspoint array. The programmable crosspoint includes programmable crosspoints at the points at which a first set of approximately parallel conductive elements directly overlap conductive elements of a second set of approximately parallel conductive elements. In one approach, large-scale integration of programmable crosspoints is achieved with nanowire crossbars comprising multiple layers of parallel nanowires. The grid-like nanowire crossbars provide a two-dimensional array of programmable crosspoints at the closest points of contact between nanowires of a first layer, oriented in a first direction, and nanowires of a second layer, oriented in a second direction approximately perpendicular to the first direction. The footprints of the programmable crosspoints are very small in nanowire crossbars because the nanowires can be patterned using nanoimprint fabrication methods or extreme ultraviolet ("EUV") interference lithography, both capable of producing nanowires with 10-nanometer or smaller widths or diameters. Programmable crosspoints can be stacked, so that high densities of programmable crosspoints can be produced using even conventional photolithography. A broad range of materials exhibiting useful electrical properties, including purely linear-resistance switching or nonlinear-resistance switching with diode-like properties, can be employed in manufacturing programmable crosspoints, including metal oxides, perovskites, chalcogenides, organic films, and self assembled molecular monolayers. While programmable crosspoint arrays and nanowire crossbars are becoming increasingly well understood and well characterized, challenges remain in using these nanoscale structures to implement logic circuits. Researchers and developers continue to seek to implement useful and practical applications of nanoscale electronic structures.

BRIEF DESCRIPTION OF THE DRAWINGS

FIGS. 3A-E illustrate the overall organization and patterning of one class of two-layer nanoscale/microscale-device embodiments of the present invention.

FIGS. 11A-F illustrate moving a data value from one arbitrary programmable crosspoint to another arbitrary programmable crosspoint within the nanoscale layer of a hybrid-nanoscale/microscale device that represents one embodiment of the present invention.

FIGS. 12A-G illustrate implementation of the Boolean IMP operation is implemented.

DETAILED DESCRIPTION OF THE INVENTION

Figure 1:
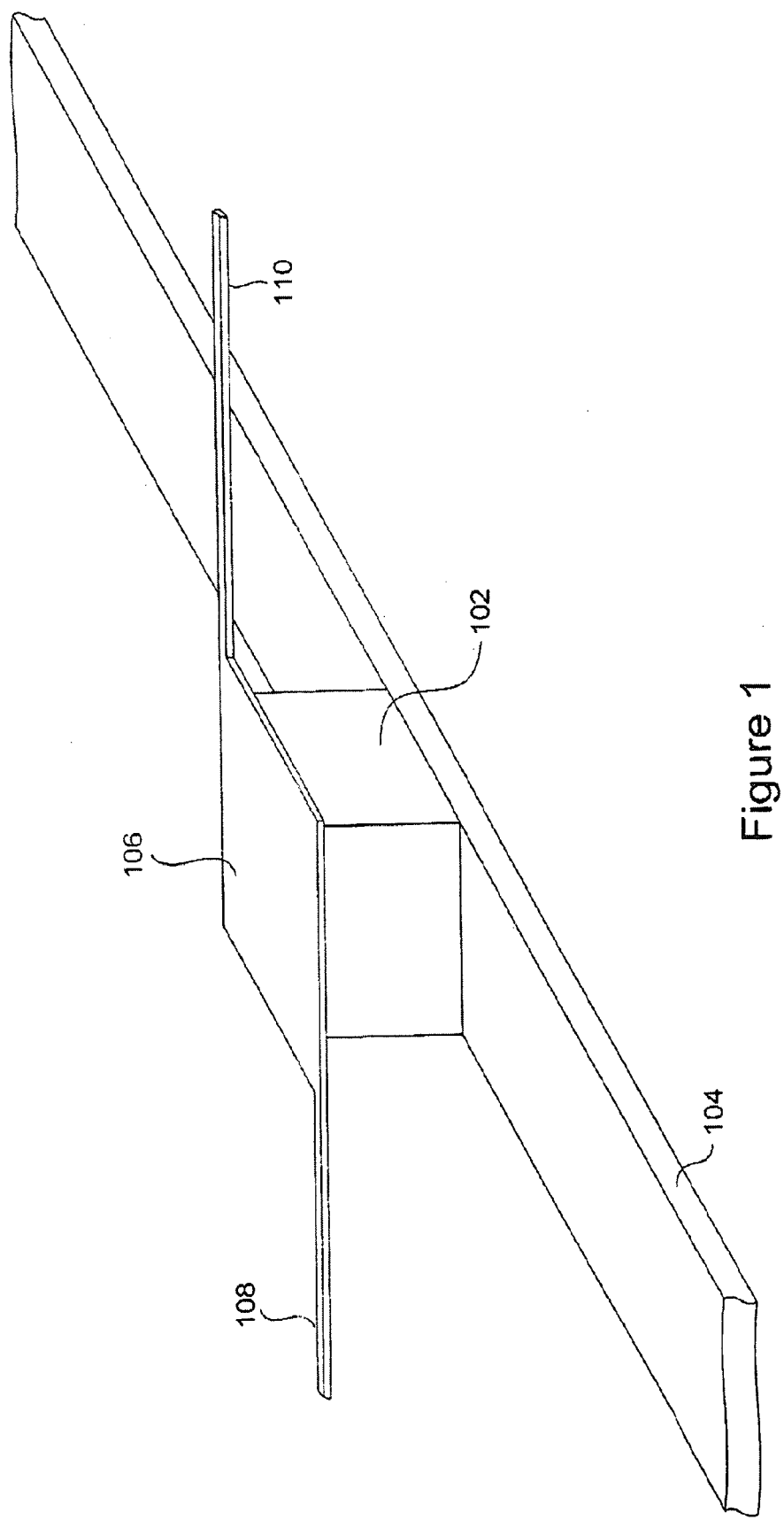
FIG. 1 illustrates a single pin/pad interface within a two-layer nanoscale/microscale embodiment of the present invention.

Embodiments of the present invention are directed to hybrid nanoscale/microscale devices that store data and carry out logic operations on stored data in a nanoscale layer and that control data input, data output, data movement, logic-operation execution, and timing from a microscale or submicroscale layer that interfaces with the nanoscale layer through a two-dimensional array of microscale or submicroscale pins. In the current discussion, the term "nanoscale" refers to features and components with a least one dimension smaller than 100 nanometers. Alternatively, the term "nanoscale" may refer to features and components with at least one dimension smaller than 50 nanometers, and, in certain cases, less than 10 nanometers. The term "submicroscale" generally refers to features and components with at least on dimension smaller than 1 micron, and the term "microscale" refers to features and components with dimensions equal to, or greater than, 1 micron. In general, microscale and submicroscale features and components are fabricated by conventional photolithographic techniques, while nanoscale components and features are generally currently fabricated using nanoimprint techniques, EUV lithography, and other non-photolithographic techniques. Alternatively, for feature sizes larger than 20 nm, standard EUV photolithography can be used. In order to avoid unnecessary recitation of the phrase "microscale and/or submicroscale layer," and similar phrases, and to avoid unnecessary recitation of the phrase "predominantly nanoscale layer," the phrase "microscale layer" is assumed to refer to a layer within a two-layer device that includes predominantly microscale and/or submicroscale circuitry, and the phrase "nanoscale layer" is assumed to refer to a layer within a two-layer device that includes features with at least one nanoscale dimension, including pad-interconnected-nanowire units, described below, or nanowires, also described below. Thus, a hybrid nanoscale/microscale device includes a microscale layer that includes predominantly microscale and/or submicroscale circuitry and a nanoscale layer that includes nanoscale features, such as pad-interconnected-nanowire units, described below. In certain embodiments of the present invention, the nanoscale layer of the hybrid devices may contain somewhat larger features that implement programmable-crosspoints and that are produced by EUV lithography or even convention photolithography. In these embodiments of the present invention, the devices are more accurately described as hybrid programmable-crosspoint-based/conventional-microscale devices. The phrase "hybrid nanoscale/microscale device" refers either to a hybrid device that includes one or more nanoscale as well as to a hybrid programmable-crosspoint-based/conventional-microscale device, in which the programmable-crosspoint-based layer or layers may be implemented using photolithography. The nanoscale/microscale and nanoscale/submicroscale logic structures of the present invention take advantage of dense nanoscale structures within the nanoscale layer for data storage and binary-register-to-binary-register logic operations, while taking advantage of well-known microscale and submicroscale circuitry within the microscale layer, including timing circuits and high-level logic-operation-execution planning-and-control circuitry for controlling data storage and register-to-register-like logic operations.

A described hybrid-nanoscale/microscale-device embodiment of the present invention interconnects pads in the nanoscale layer with correspondingly regularly patterned microscale or submicroscale pins, referred to as "pins," in the microscale layer. Each pad in the nanoscale layer may be interconnected through nanowire-junctions with a large number of neighboring pads through programmable crosspoints in lattice-like channels of nanowires. A pad within the nanoscale layer can be accessed by conventional submicroscale or microscale electronics in the second, predominantly microscale layer via a submicroscale or microscale pin.

FIG. 1 illustrates a single pin/pad interface within a two-layer nanoscale/microscale-device embodiment of the present invention. As shown in FIG. 1, a pin 102 connects to a submicroscale or microscale signal line 104. The pin 102 and signal line 104 are both embedded within the microscale layer of the two-layer hybrid-nanoscale/microscale-device embodiment of the present invention. The pin 102 also electrically contacts a pad 106 that is, in turn, interconnected with a first nanowire 108 and a second nanowire 110. The pad 106 and attached nanowires 108 and 110 together compose a pad-interconnected-nanowire unit ("PINU") of one sub-layer of the nanoscale layer of the two-layer hybrid-nanoscale/microscale-device embodiment of the present invention. As discussed below, PINUs may be used when nanoscale layers are implemented by certain techniques, and straight nanowires may be alternatively used, without pads, when nanoscale layers are implemented by other techniques. The pads may facilitate alignment of programmable-crosspoint-implementing structures with microscale pins when certain manufacturing techniques are employed.

Figure 2:
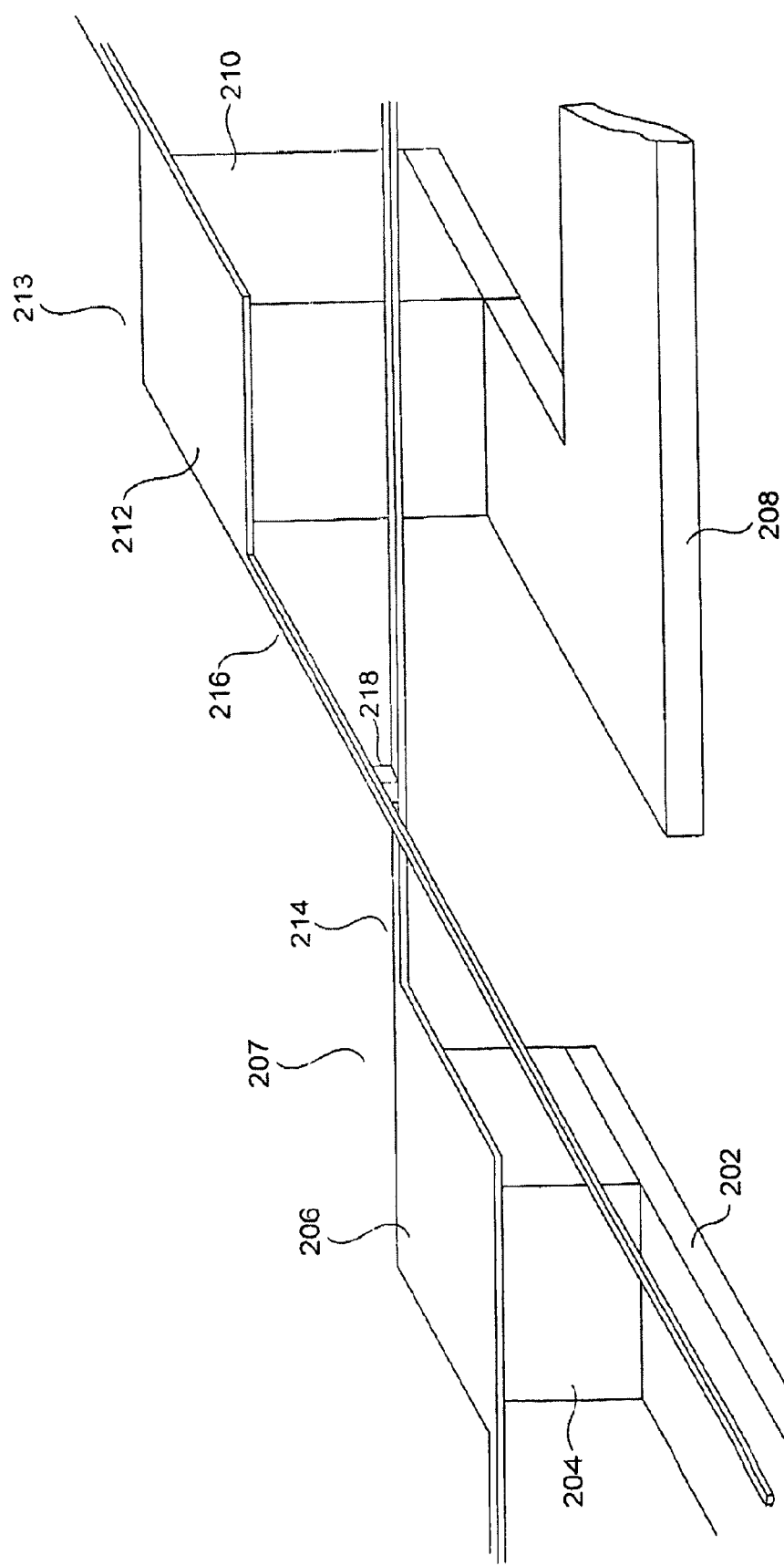
FIG. 2 illustrates, in the same fashion as FIG. 1, two pin/pad interfaces interconnected by a programmable crosspoint within a nanoscale/microscale-interface embodiment of the present invention.

FIG. 2 illustrates, in the same fashion as FIG. 1, two pad/pin interfaces within a nanoscale/microscale-device embodiment of the present invention. In FIG. 2, a first microscale or submicroscale signal line 202 electrically contacts a first pin 204. The first pin also electrically contacts the pad 206 of a first PINU 207. The first PINU 207 resides in a first sub-layer of the nanoscale layer of the nanoscale/microscale device. A second submicroscale or microscale signal line 208 electrically contacts a second pin 210. The second pin also electrically contacts the pad 212 of a second PINU 213. The second PINU 213 resides within a second sub-layer of the nanoscale layer of the two-layer nanoscale microscale device. Two nanowires 214 and 216 of the two PINUs 207 and 213 intersect at a programmable crosspoint 218, which, like the programmable crosspoints in nanowire crossbars, may comprise a memristive metal oxide thin film that implements a passive or active nanoscale electrical component, such as a resistor, a variable-resistance resistor, a diode, a transistor, or other passive or active component.

In many embodiments of the present invention, pairs of pins of the microscale layer of a two-layer nanoscale/microscale device are electrically interconnected via a pair of PINUs or nanowires and a single programmable crosspoint. In certain types of electronic devices that incorporate two-layer nanoscale/microscale devices, including mixed-scale integrated circuits, the microscale layer may implement various types of logic and functional units, and the nanoscale layer may serve primarily to interconnect the various submicroscale or microscale components and logic. By using nanoscale electronics for component and logic interconnection, the area and power consumption of a mixed-scale integrated circuit or other electronic device can both be significantly decreased.

Figure 3A:
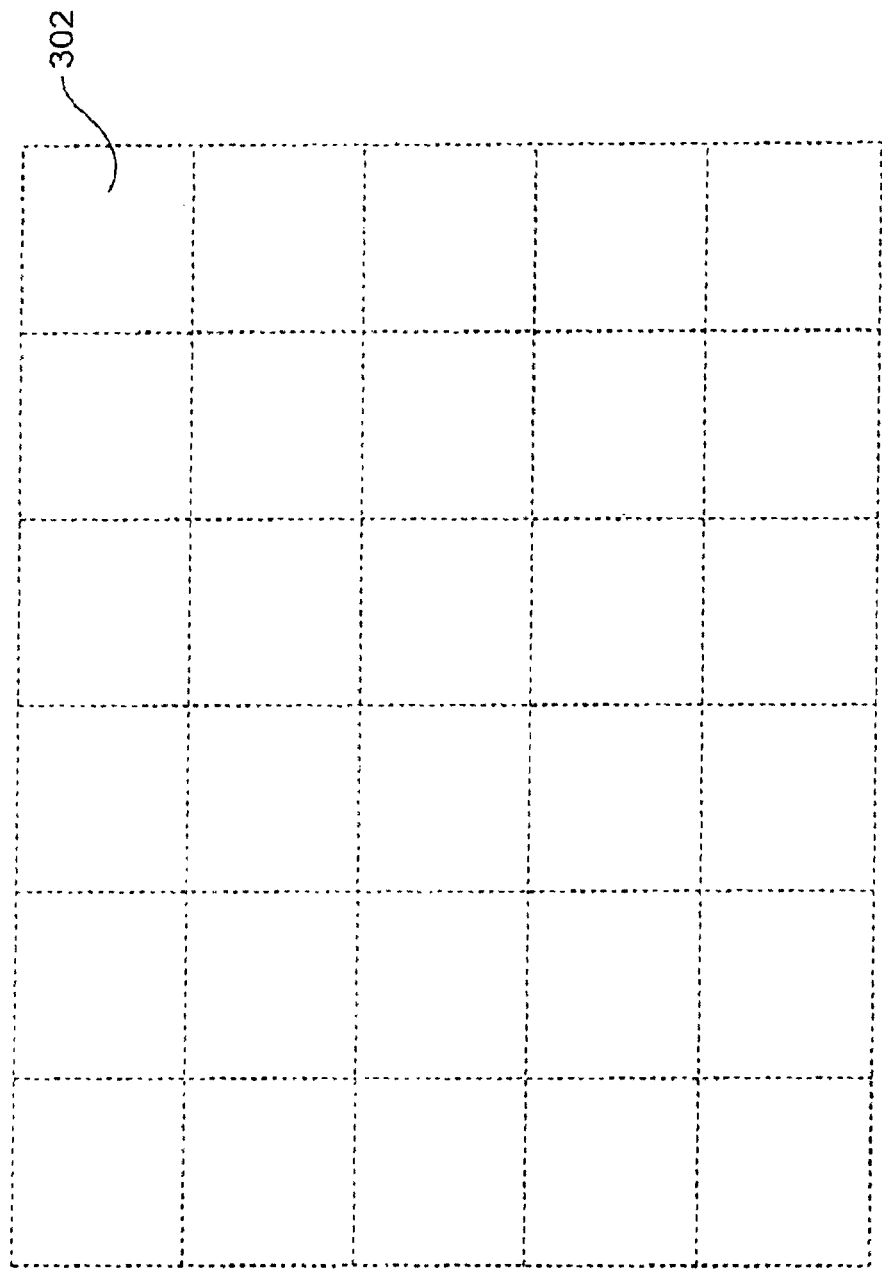

FIGS. 3A-E illustrate the overall organization and patterning of one class of two-layer nanoscale/microscale-device embodiments of the present invention. As shown in FIG. 3A, the microscale layer of the two-layer nanoscale/microscale device can be considered to be organized into square or rectangular cells to form a rectilinear grid of microscale cells. FIG. 3A shows a tiny portion of the microscale layer of a two-layer nanoscale/microscale device that includes 30 microscale cells, such as microscale cell 302. The rectilinear organization of the microscale layer reflects only the arrangements of pins within the microscale layer. The underlying submicroscale or microscale circuitry and components may not be so regularly patterned and may not otherwise conform to the rectilinear pattern illustrated in FIG. 3A. In general, each microscale cell contains a small number of pins that are identically arranged and positioned in each microscale cell of the rectilinear grid. In subsequent figures, two-pin cells are illustrated. In various prototype designs of functional devices, four-pin microscale cells are employed. Because the pins are identically arranged in each microscale cell, the pins also form a regular pattern across the surface of the microscale layer.

FIG. 3B shows the organization of pad-interconnected-nanowire units ("PINUs") within a small portion of a first sub-layer of the nanoscale layer of a two-layer nanoscale/microscale-device embodiment of the present invention. The PINUs are arranged so that the centers of the pads of the PINUs fall on linear columns and rows. In FIG. 3B, a horizontal dashed line 302 is drawn through the centers of pads in one row, and a vertical dashed line 304 is drawn through the centers of a column of pads. The PINUs, including both the pad-portion and nanowire-portions of each PINU, are rotated by a small angle θ (306 in FIG. 3B) with respect to the row direction. Rotation of the PINUs allows nanowires of the PINUs to form closely spaced nanowire bundles, such as closely spaced nanowire bundle 308 in FIG. 3B, oriented at the small angle θ with respect to the row direction. In the described embodiments of the two-layer hybrid nanoscale/microscale device, the rows and columns that define the center of the PINUs form a rectilinear grid with square cells, although, in alternative embodiments, the columns need not be perpendicular to the rows, and the cells may be rhomboid. In the described embodiments of the present invention, the centers of the pads of the first nanoscale sub-layer are positioned to directly overlie the centers of approximately one-half of the pins in the microscale layer of the two-layer nanoscale/microscale device, with the remaining pins centered within each square nanoscale cell of the first nanoscale sub-layer.

Figure 3C:
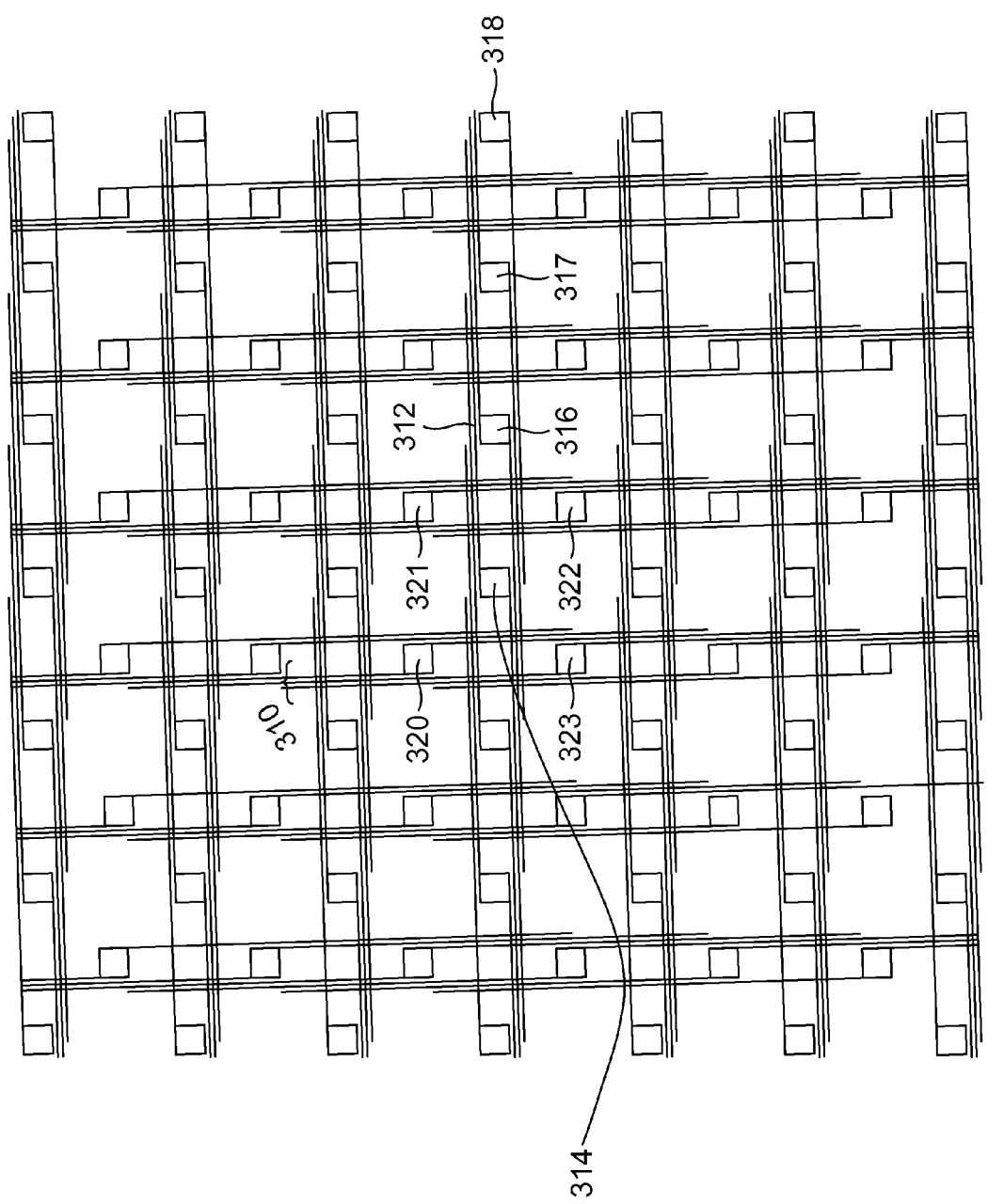

FIG. 3C shows a second nanoscale sub-layer overlaying the first nanoscale sub-layer shown in FIG. 3B to form a small portion of the tessellated, predominately nanoscale layer of a two-layer hybrid-nanoscale/microscale-device embodiment of the present invention. In the described embodiments of the present invention, the second nanoscale sub-layer is identical in organization to the first nanoscale sub-layer, but is rotated 90 degrees with respect to the first nanoscale sub-layer and translated, by 1/√2 times the pad-repeat distance along columns and rows of the first nanoscale sub-layer, in a diagonal direction, so that the pads of the second nanoscale sub-layer are located at the centers of the cells formed by the pads of the first nanoscale sub-layer and so that each second-sub-layer pad is, in the case of square cells, equidistant from the nearest surrounding pads of the first nanoscale sub-layer. In this organization, the nanowires of the second nanoscale sub-layer form parallel, closely spaced bundles, such as parallel, closely spaced bundle 310, perpendicular to the parallel, closely spaced bundles of nanowires of the first nanoscale sub-layer. In the nanoscale layer shown in FIG. 3C, each of the two nanowires of each PINU has a length equal to approximately three times the repeat distance of pads in the column and row directions of the nanoscale sub-layer that contains the PINU. For example, nanowire 312 emanating from pad 314 of the second nanoscale sub-layer spans pads 316-318 of the first nanoscale sub-layer, which have pad-repeat distances equal to those in the second nanoscale sub-layer. In alternative embodiments, the nanowires may have much greater lengths with respect to the pad repeat distance, as long as a nanowire in one layer is not positioned so closely to a pin or pad in the other layer that there is an undesired electrical interaction between the two. The longer the nanowires, the more nanowires that may be present in each parallel, closely spaced bundle of nanowires. Pad 314 is representative of the vast majority of pads within a large, nanoscale layer of the illustrated two-layer nanoscale/microscale device, and is surrounded by two vertical and two horizontal channels, each comprising parallel, closely spaced bundles having a three-nanowire width, which separate pad 314 from its four nearest neighbor pads 320-323 in the first nanoscale sub-layer.

Figure 3D:
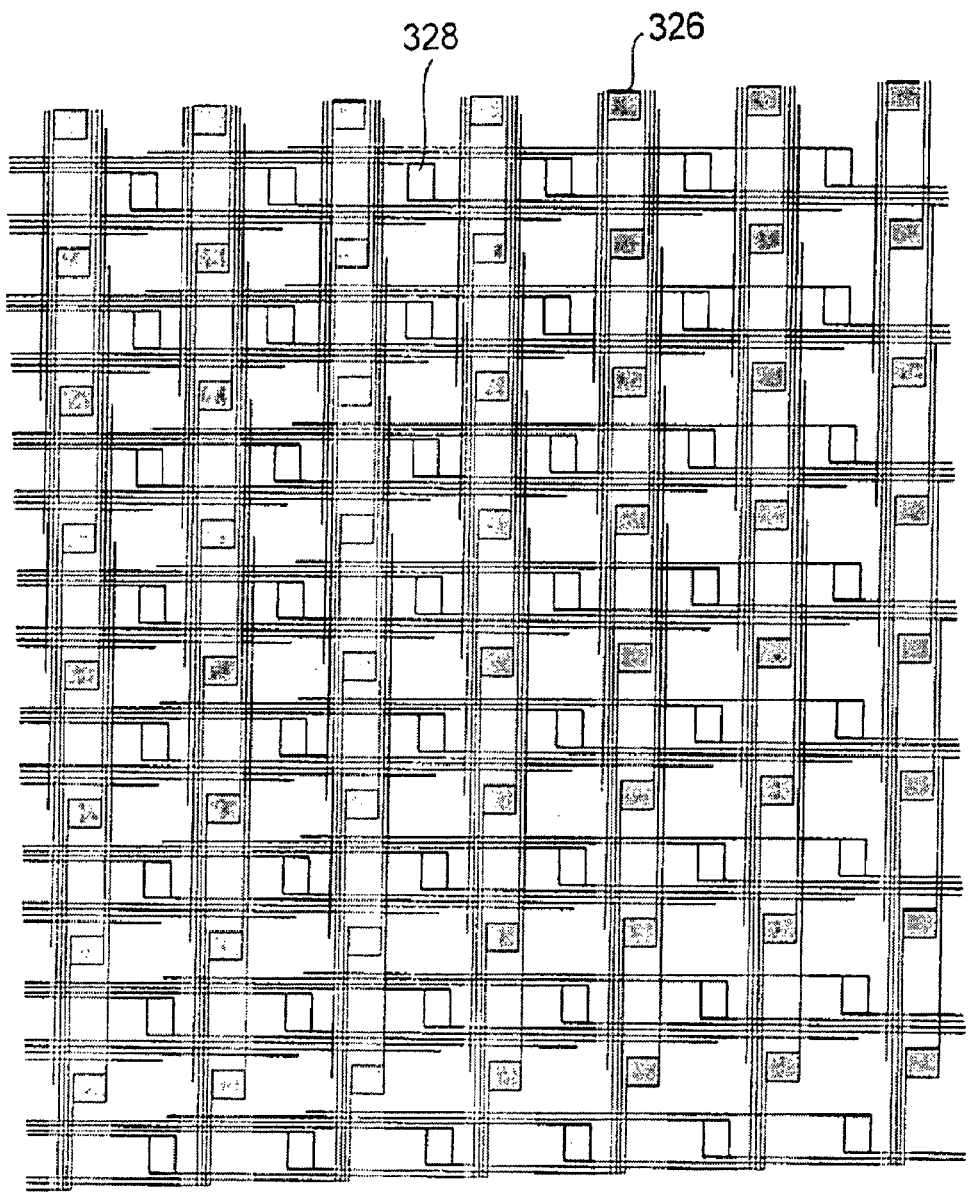
Figure 3E:
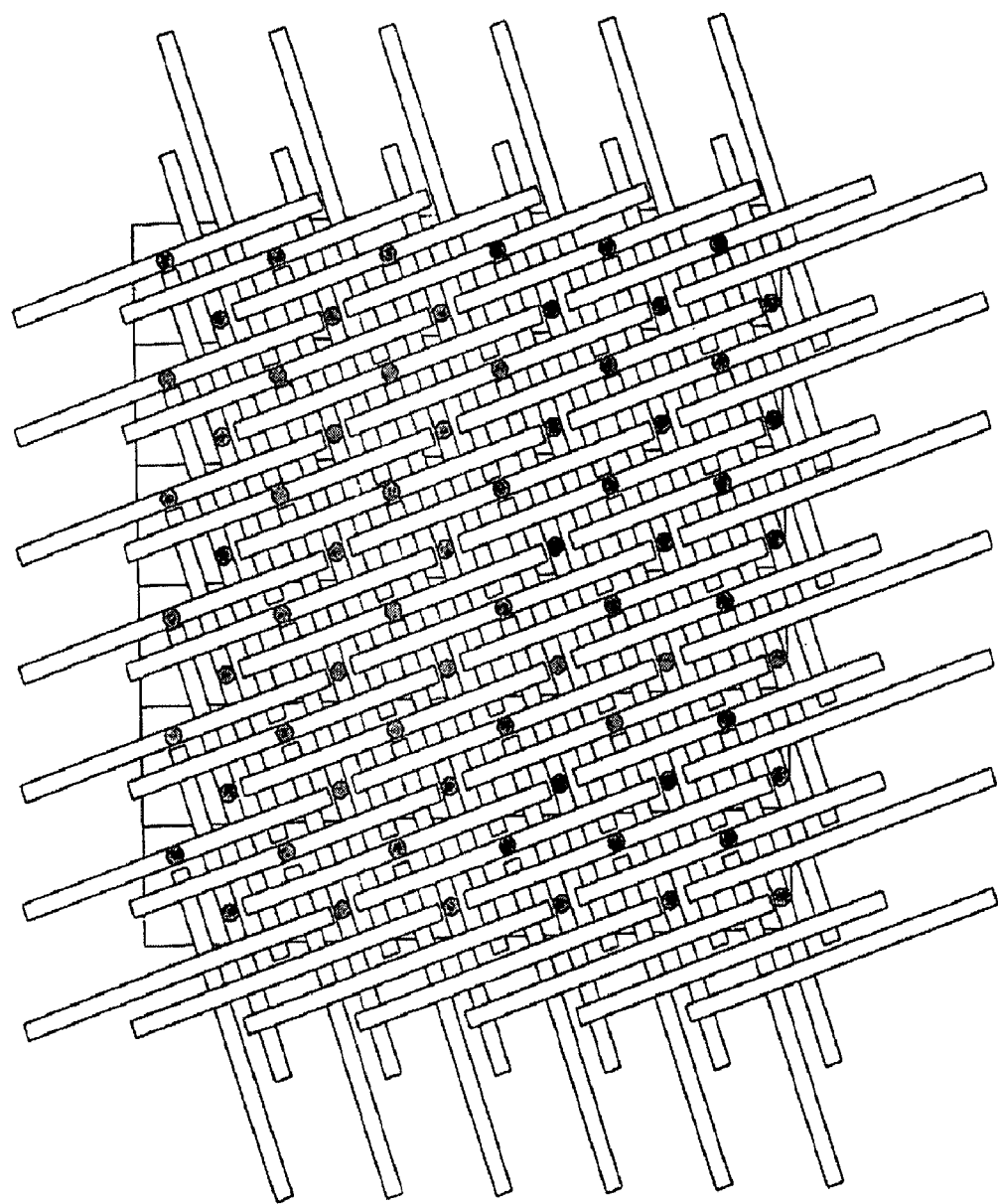

FIG. 3D illustrates, in a fashion similar to FIGS. 3B and 3C, a tessellated, nanoscale layer of a two-layer hybrid-nanoscale/microscale-device embodiment of the present invention in which each of the two nanowires of each PINU have a length equal to approximately four times the repeat distance of the pads within the nanoscale sub-layer that contains the PINU. While, in FIG. 3C, the parallel, closely spaced bundles of nanowires each includes, at each point, three separate nanowires, in the parallel, closely spaced bundles of nanowires in FIG. 3D each includes, at each point, up to four nanowires. Each channel is actually composed of many different nanowires, since channels span the entire, or a large portion of the, nanoscale layer, while individual nanowires are generally shorter. Thus, the lengths of the nanowires of each PINU determine the width, in nanowires, of the parallel, closely spaced bundles of nanowires, or channels, within the tessellated, nanoscale layer. In FIG. 3D, the darkly colored pads, such as pad 326, lie in a first nanoscale sub-layer, and the lighter shaded pads, such as pad 328, lie in a second nanoscale sub-layer. Alternatively, for patterning technologies with high overlay alignment, such as photolithography, the nanoscale array can be very dense, as illustrated in FIG. 3E.

Figure 4:
FIG. 4 illustrates the first-nanoscale-sub-layer pads electrically connected, through a single programmable crosspoint, to one particular second-nanoscale-sub-layer pad in the tessellated, nanoscale layer of a two-layer nanoscale/microscale embodiment of the present invention shown in FIG. 4D.

FIG. 4 illustrates the first-nanoscale-sub-layer pads potentially electrically connected, through a single programmable crosspoint, to one particular second-nanoscale-sub-layer pad in the tessellated, nanoscale layer of a two-layer hybrid-nanoscale/microscale-device embodiment of the present invention shown in FIG. 3D. As discussed above, the nanowires 401 and 402 emanating from the particular second-nanoscale-sub-layer pad 406 each span four pad-repeat distances. Each of the two nanowires 401 and 402 therefore cross over, and form programmable crosspoints, with the four nanowires in eight different channels. For example, nanowire 402 forms programmable crosspoints with each of the four nanowires in channels 408-415. Each programmable crosspoint potentially connects, depending on the nature of the programmable crosspoint, the nanowire with a first-nanoscale-layer PINU. The particular second-nanoscale-sub-layer pad 406 may be electrically interconnected with the 64 first-nanoscale-level pads, such as first-nanoscale-sub-layer pad 416, shown in FIG. 4, and numbered 1-64. A single pin of the microscale or submicroscale layer of the two-layer nanoscale/microscale device may therefore be connected, in the embodiment illustrated in FIG. 3D, to each of up to 64 neighboring pins by two PINUs and a single intervening programmable crosspoint. When the length of the nanowires increases, the number of nanowires in each channel increases, the number of channels spanned by a PINU increases, and the number of pads or pins interconnected through a single programmable crosspoint geometrically increases. For example, in a nanoscale layer of a hybrid-nanoscale/microscale-device embodiment of the present invention in which each nanowire of a PINU spans ten pad-repeat distances, a given pad or pin may be electrically interconnected, through single programmable crosspoints, with up to 400 neighboring pins or pads.

Figure 5:
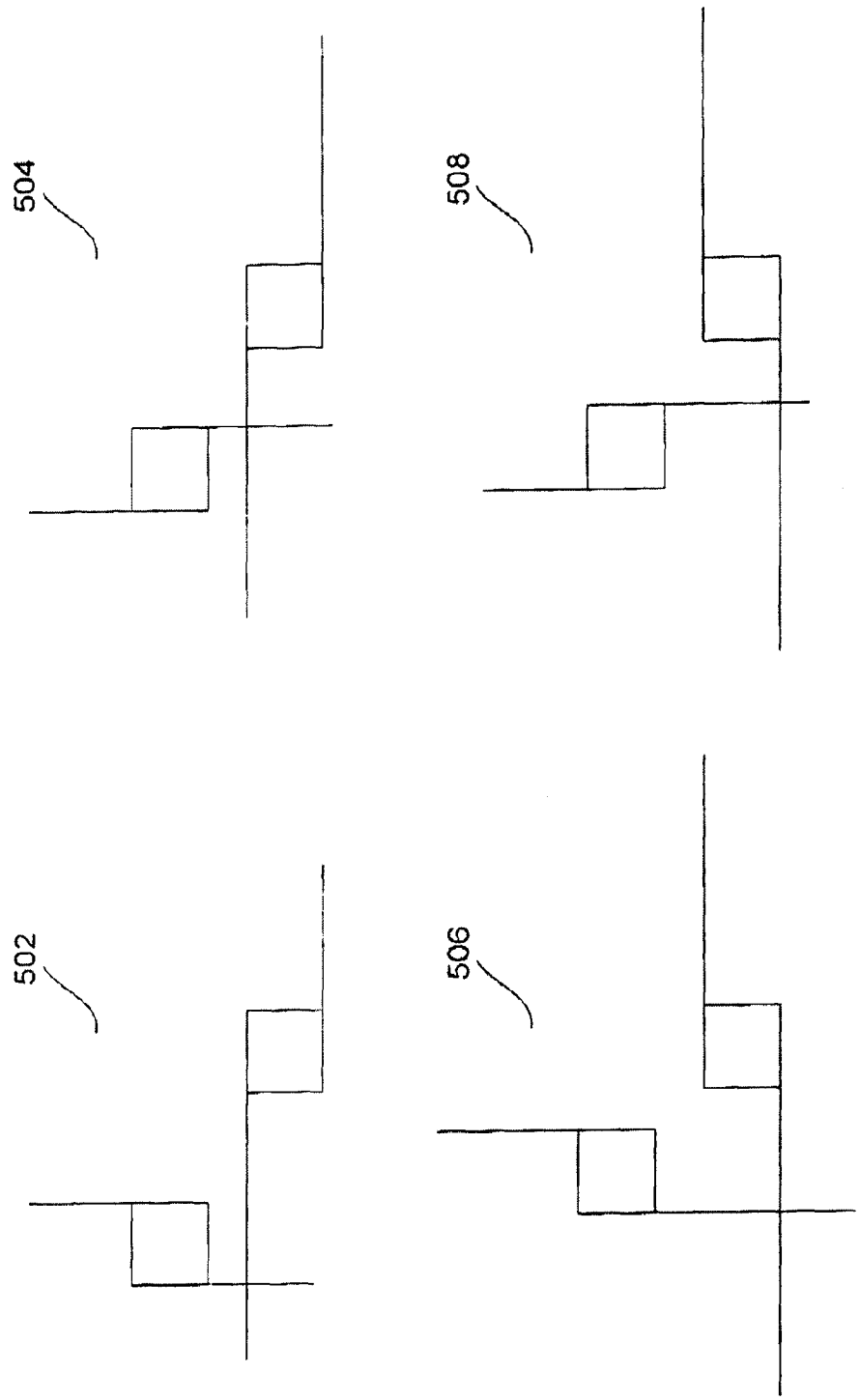
FIG. 5 illustrates four symmetry-related arrangements of a first-nanoscale-sub-layer pad with a second-nanoscale-sub-layer pad within a tessellated, nanoscale layer of a two-layer nanoscale/microscale embodiment of the present invention.

There are an almost limitless number of different configurations of a tessellated, nanoscale layer that may be used in a two-layer nanoscale/microscale device according to the present invention. As discussed above, pad-repeat distances may vary, angles between rows and columns of pads may depart from 90°, and pad-cornered cells of the tessellated, nanoscale layer may be, in addition to squares and rectangles, diamond shaped or rhomboid in nature. Furthermore, for any given arrangement of PINUs, there are a number of other symmetry-related arrangements with equivalent pad spacings and column and row orientations. FIG. 5 illustrates four symmetry-related arrangements 502, 504, 506, and 508 of a first-nanoscale-sub-layer pad and a second-nanoscale-sub-layer pad within a tessellated, nanoscale layer of a two-layer hybrid-nanoscale/microscale-device embodiment of the present invention. In three-dimensional networks of PINUs and other features and components within multiple nanoscale sub-layers, a much larger number of symmetry related arrangements are possible.

Figure 6:
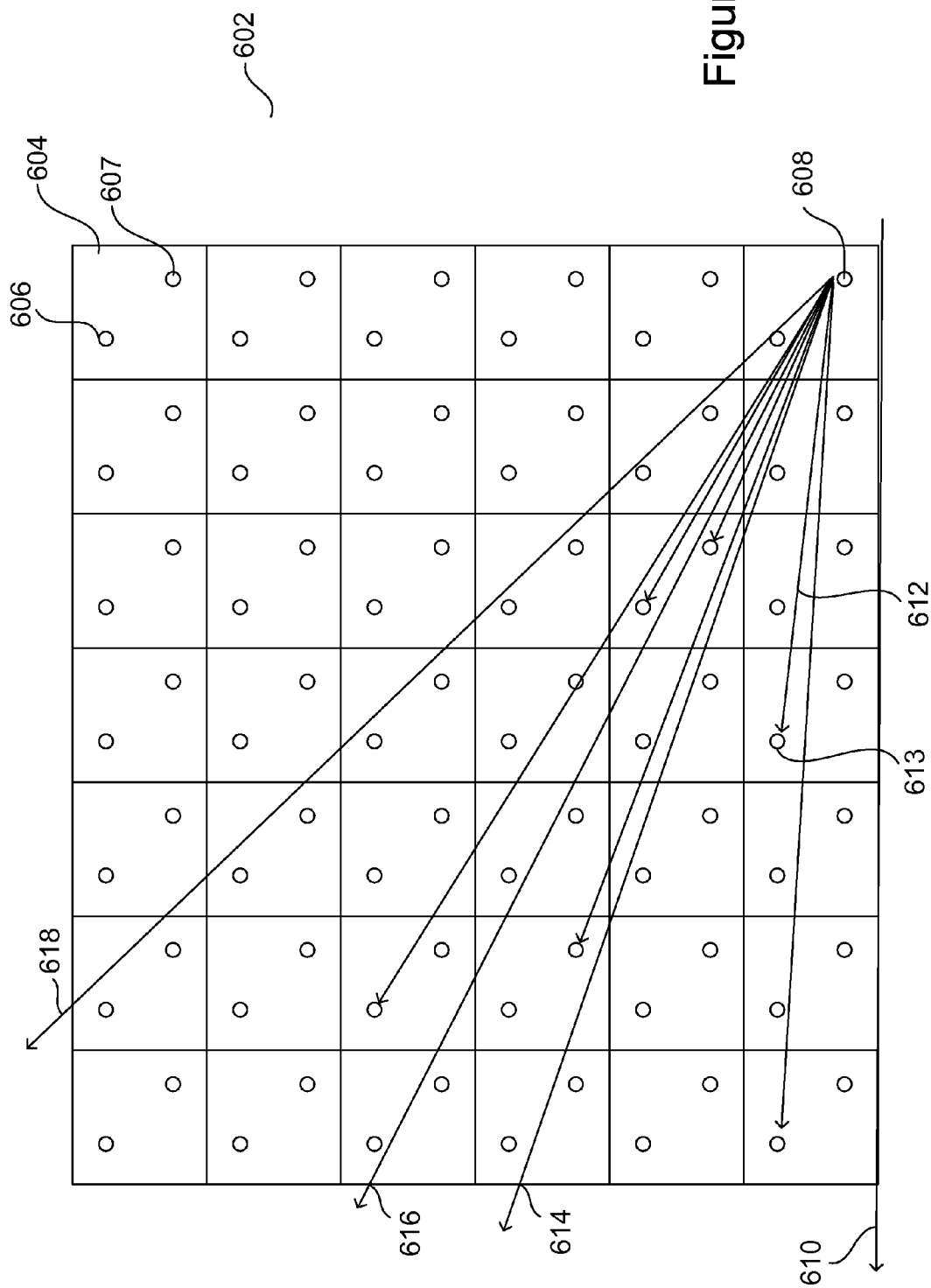
FIG. 6 shows a rectilinear grid of square microscale cells, each cell containing two different microscale pins.

A two-layer nanoscale/microscale device of the present invention can be characterized by a number of different parameters. Moreover, various embodiments of the present invention can be optimized for particular applications by optimizing one or more of these parameters with respect to various different criteria. One characterizing parameter is the angle θ by which PINUs are rotated with respect to a linear row of pad centers within a nanoscale sub-layer. FIG. 6 shows a rectilinear grid 602 of square microscale cells, such as microscale cell 604, each cell containing two different microscale pins, such as microscale pins 606-607 in microscale cell 604. The rectilinear grid 602 in FIG. 6 represents the microscale layer of a two-layer nanoscale/microscale device above which the tessellated, nanoscale layer is fabricated. Assuming that the pad of a first-nanoscale-level PINU is to be fabricated above pin 608, the angle θ may be chosen to optimize the two-layer nanoscale/microscale device. The numerous arrows emanating from pin 608, such as arrow 610, in FIG. 6 represent a few of the many choices for the angle θ with respect to the direction of the rows of pins within the rectilinear grid 602. In general, it is desirable to have nanowires as long as possible, in order to allow for placement of as many nanowires as possible in each channel. Maximizing the number of nanowires per channel in turn maximizes the potential connectivity between pins implemented within the microscale layer. A characteristic parameter of the two-layer nanoscale/microscale device is a minimum distance of separation between a nanowire and any microscale pin other than the microscale pin on which the pad of the PINU including the nanowire is centered.

The maximum possible lengths of the nanowires emanating from a PINU positioned over pin 608 vary with θ. For example, in the direction represented by arrow 612, the nanowire would need to be relatively short, to avoid coming within a distance less than a minimum separation distance to any neighboring pin, such as neighboring pin 613. Approach of a nanowire to a neighboring microscale pin closer than a threshold minimum distance may result in a short within the nanoscale layer. In the rectilinear grid shown in FIG. 6, certain values of θ corresponding to the directions represented by arrows 610, 614, 616, and 618 are clearly more favorable than others, including those corresponding to the direction represented by arrow 612. The θ angles represented by arrows 610 and 618 correspond to the most favorable directions. In order to fabricate PINUs with longest-possible nanowires, one may seek to minimize the angle θ in order to, as closely as possible, align nanowires with the horizontal rows of pins, as represented by direction 610 in FIG. 6. In alternative embodiments of the present invention, the angle θ may be selected to be as close as possible to the direction indicated by arrow 618 in FIG. 6.

In the described embodiments of the present invention, each PINU has equal-length nanowires. Equal length nanowires are not required, but may be desirable for minimizing reactive-capacitance delays within the nanoscale layer for a particular degree of pin interconnection. The greater symmetry provided by equal-length nanowires may, in many applications, also facilitates routing of signals between microscale pins.

Another characteristic parameter for two-layer nanoscale/microscale devices of the present invention is the dimensions of PINU pads. In general, when the area of the pads is relatively small, a greater fraction of the area of the nanoscale layer can be devoted to nanowires and nanowire interconnections. Additional parameters include a minimal distance of separation between nanowires, the width of nanowires, dimensions of the microscale-layer pins, dimensions of the repeating units, or cells, that define the interface between the microscale and nanoscale layers, a minimum distance of separation between nanowires and pins, and parameters that characterize uncertainties and errors in alignment of the nanoscale layer to the microscale layer and in the positioning of features within each layer. All of these parameters affect the ultimate density of interconnection that can be achieved in various hybrid-nanoscale/microscale-device embodiments of the present invention. Certain of these parameters, such as the minimum separation distances between nanowires and between nanowires and pins and the nanowire widths may depend on the materials from which the hybrid-nanoscale/microscale-device embodiments of the present invention are fabricated, on the types of logic and interconnections implemented in the nanoscale layer, on the operational voltage and current levels within the hybrid-nanoscale/microscale-device embodiments, on the processes used to fabricate the hybrid-nanoscale/microscale-device embodiments of the present invention, and other such conditions, characteristics, and constraints. These various parameters can be analyzed and adjusted in order to find optimal dimensions, special organizations, and operational characteristics for particular applications of various different hybrid-nanoscale/microscale-device embodiments of the present invention.

Many different types of programmable crosspoints can be fabricated within the nanoscale layer of a nanoscale/microscale device. Bistable programmable crosspoints can be used as conventional switches. It is also possible to fabricate programmable crosspoints that behave as diodes, transistors, variable resistors, and that exhibit even more exotic behaviors and characteristics without analogs in microscale devices. Such a diverse palette of components types allows for implementation of digital and analog logic in the nanoscale layer, as well as self-modifying tuning and defect-compensating functionality that provides the nanoscale/microscale device with an ability to be configured following manufacture and to configure itself, over time, to optimize performance and to compensate for defects. A circuit with sufficient built-in logic may monitor its performance and correctness of operation in order to work around defects that inevitably arise over time due to environmental and operational hazards, such as cosmic rays, material degradation, static charges, and transient voltage pulses.

As one example, variable-resistor-like programmable crosspoints can be used to trim an integrated circuit. Resistance values for various variable-resistor programmable crosspoints can be selected, for example, to adjust internal voltages to compensate for variances in other components and features of a circuit above tolerance thresholds that would otherwise cause the circuit to exhibit undesired behavior and characteristics or to completely fail. For example, a defective switch may transition from one state to another between 3 and 4 volts, instead of between 0 volts and 2 volts, resulting in the switch being stuck in only one state despite input voltages that vary between 0 V and 2 V, to which the defective switch was designed to respond. By trimming an upstream variable-resistance programmable crosspoint to a lower resistance value, the input voltages to the switch may be adjusted from between 0 V and 2 V to between 3 V and 4 V, so that the switch is appropriately responsive to the input voltages.

As further examples, configurable programmable crosspoints may be used to shunt signals from a defective logic module to a redundant, equivalent module or to a new configured, replacement module, in order to isolate the defective module. Test or monitor logic within an integrated circuit may, using spare cycles and resource, periodically or continuously monitor an integrated circuit to detect and compensate for defective or functionally deteriorating components and features, and to configure replacement components and features.

While monitoring and repair of an integrated circuit, either as a result of internal testing and monitoring logic. or as a result of external testing and monitoring components, including human technicians, can increase manufacturing yields and extend the useful lifetimes of integrated circuits, optimization logic within a mixed-scale-device embodiment of the present invention may lead to more highly customized and operationally efficient integrated circuits, tuned to specific applications, than could be economically designed and manufactured by volume manufacturing processes. Over time, an integrated circuit may recognize and optimize operational patterns and heavily used functionality by reconfiguring itself to more efficiently carry out often repeated tasks, much like particular software routines may be specifically optimized and tuned beyond initial encoding produced by compilers from high-level languages. Furthermore, the electronic devices within which integrated circuits are used may themselves contain defects, or develop defects or degrade, over time, and a mixed-scale-device embodiment of the present invention may reconfigure itself to compensate for such external defects and inefficiencies, either as a result of feedback provided by external testing and monitoring functionality, or by application-specific monitoring and testing configured into the mixed-scale device in a post-manufacturing configuration process. Nanoscale layers of a mixed-scale device provide for sufficient redundancy of interconnection and components, as well as stable, but reconfigurable components and features, to allow for effective and comprehensive post-manufacturing tuning, adjustment, and reconfiguration needed for self-modifying defect-compensating and optimization functionalities that can significantly improve manufacturing yields, application-specific customization, and useful lifetimes of integrated circuits.

Originally, the hybrid nanoscale/microscale-device architecture, discussed above, was contemplated to rely on the nanoscale layer primarily for the above-discussed fault-tolerant interconnection and tuning of microscale-layer components. The nanoscale interconnection layer allows for a greater density of fabrication of features within the microscale layer by providing interconnection paths that would otherwise be implemented as microscale signal lines, accounting for a significant portion of the microscale-layer real estate and producing significant constraints in microscale-component layout and design.

In hybrid-nanoscale/microscale devices of the present invention, a different partitioning of functionality between the microscale and nanoscale layers of the device is undertaken. Although, initially, the nanoscale layer was contemplated for use in microscale-component interconnection, it has since been recognized that the nanoscale layer can be used to store data and implement logic operations that are carried out on the stored data. In other words, rather than simply providing a means for interconnecting microscale components within the microscale layer, the nanoscale layer can be used to implement general data storage and computation. By implementing data storage and computation in the nanoscale layer, far denser data-storage circuitry and logic circuitry can be obtained, in a hybrid nanoscale/microscale device of the present invention, than can be obtained in traditional microscale or submicroscale integrated circuits. Furthermore, data storage in the nanoscale layer is persistent, or non-volatile, allowing for far less power dissipation than in traditional dynamic microscale and submicroscale integrated circuits that require constant refresh in order to maintain stored data values. An additional advantage is that the array-like nanoscale layer can be flexibly used and essentially continuously reprogrammed, to provide an extremely flexible and general-purpose medium for implementation of logic circuits, binary registers, and memory.

In hybrid-nanoscale/microscale devices that represent embodiments of the present invention, data storage and logic operations are carried out in the nanoscale layer, controlled by higher-level logic implemented in the microscale layer. Well-understood clock-based and timing control, for example, can be implemented in microscale or submicroscale circuitry within the microscale layer to provide timed, controlled signal pulses that initiate and control, in parallel, multiple concurrent logic operations within the nanoscale layer. Data can be collected, by traditional methodologies, and input, by the microscale layer, into nanoscale data-storage elements for use as operands in subsequent logic operations controlled by microscale circuitry. The results of computation within the nanoscale layer can be output, by microscale and submicroscale circuitry within the microscale layer, to computation-result consumers in an electronic device or system, including traditional data output and display components. By partitioning functionality within a hybrid-nanoscale/microscale device, according to the present invention, physical limitations that are being approached as the sizes of computational components are decreased and feature densities are increased within integrated circuits can be overcome and feature densities can be increased by at least an order of magnitude.

Figure 7A:
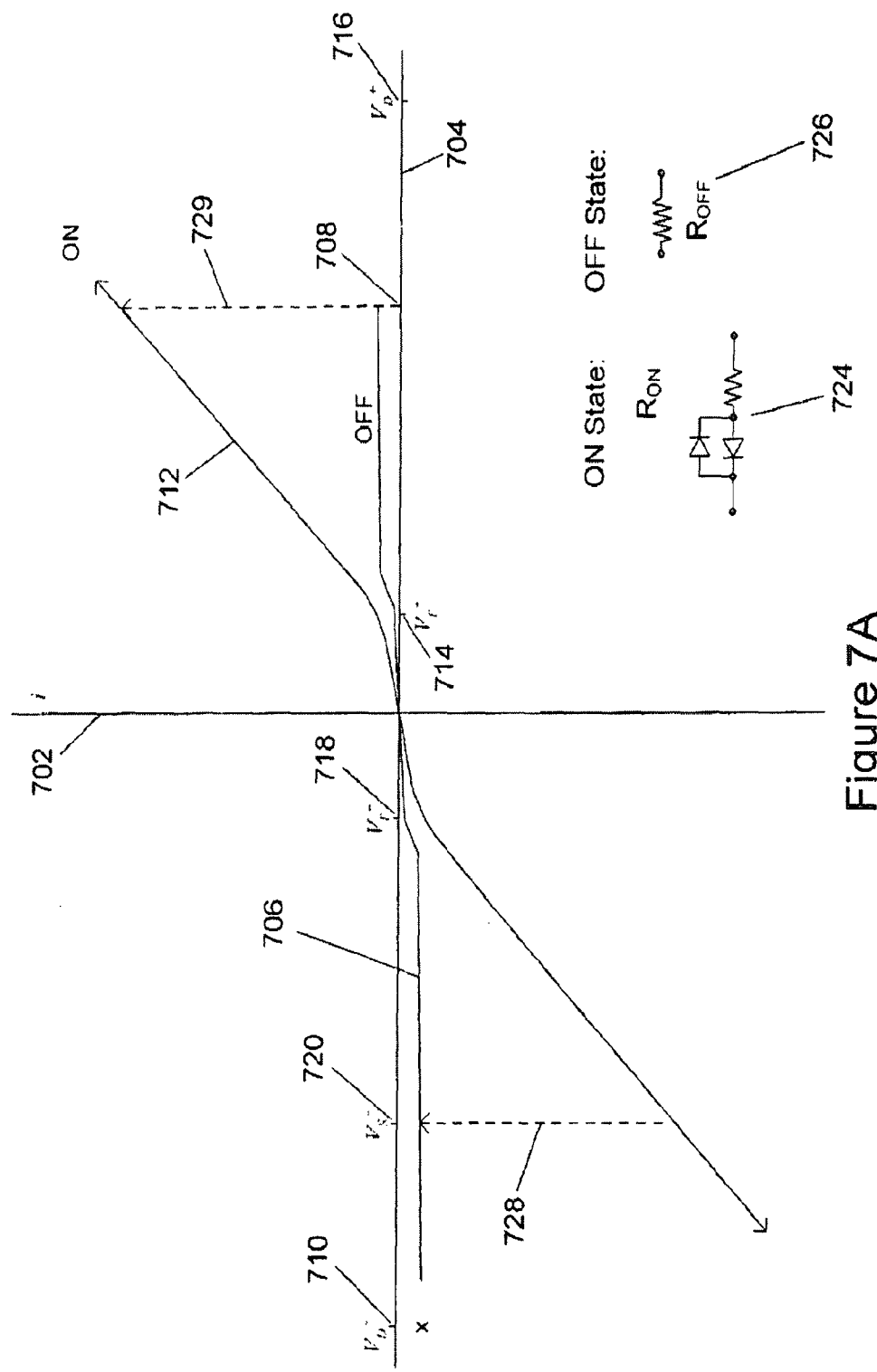
FIGS. 7A-B illustrate the non-linear resistance of a programmable crosspoint within the nanoscale layer of a hybrid-nanoscale/microscale device that represents one embodiment of the present invention.
Figure 7B:
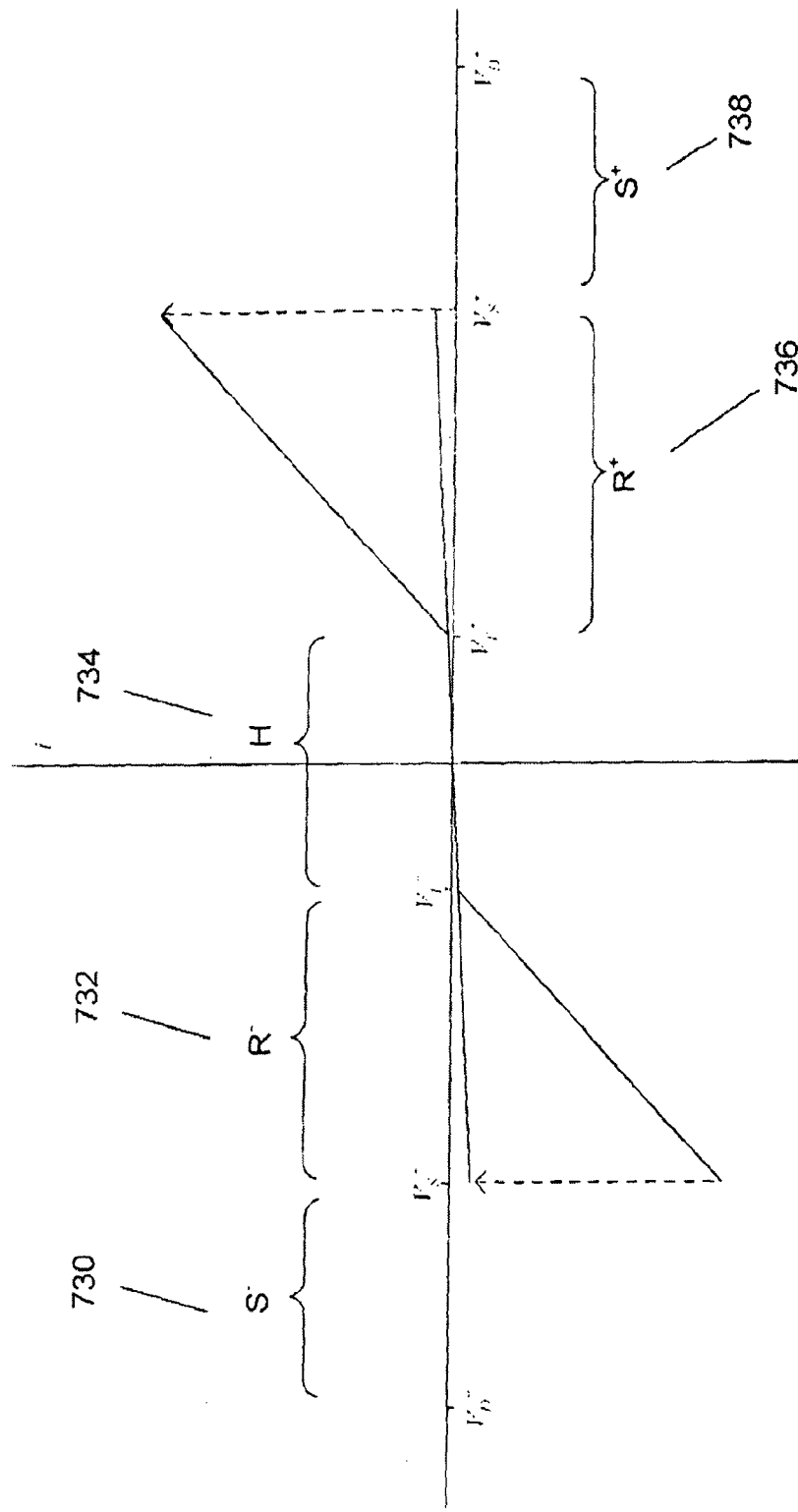

FIGS. 7A-B illustrate the non-linear resistance of a programmable crosspoint within the nanoscale layer of a hybrid-nanoscale/microscale device that represents one embodiment of the present invention. FIG. 7A shows the relationship between current, plotted with respect to the vertical axis 702, and voltage, plotted with respect to the horizontal axis 704, of a programmable crosspoint within a nanoscale layer of a hybrid-nanoscale/microscale device of the present invention to which voltages of differing magnitudes and polarities are applied. The programmable crosspoint comprises, in one embodiment of the present invention, a thin titanium dioxide bilayer formed at the point of contact between two approximately orthogonal nanowires, such as programmable crosspoint 218 in FIG. 2. The bilayer material may be the material from which the nanowires are fabricated, may be materials introduced as coatings on the nanowires, or introduced into intersection points between nanowires during fabrication of the tessellated nanoscale layer described above with reference to FIGS. 3A-E.

The programmable crosspoint exhibits two different resistance states. A first resistance state is characterized by curve 706 in FIG. 7A. This is a high-resistance state, in which little current is induced to flow through the programmable crosspoint regardless of the magnitude of applied voltage across the programmable crosspoint between the positive voltage $V_S^+$ 708 and the negative voltage $V_D^-$ 710. At applied voltages less than $V_D^-$ 710, or in other words, at negative applied voltages with magnitudes greater than or equal to $|V_D^-|$, the programmable crosspoint may physically fail. A second resistance state is characterized by curve 712 in FIG. 7A. In the second resistance state, the programmable crosspoint is generally conductive at both positive applied voltages between $V_T^+$ 714 and $V_D^+$ 716 and at negative applied voltages between $V_T^-$ 718 and $V_S^-$ 720. Due to the nonlinearity of conductance in the second resistance state, a programmable crosspoint is generally only slightly conductive, or exhibits relatively high resistance, between the positive applied voltage $V_T^+$ 714 and the negative applied voltage $V_T^-$ 718. The second resistance state, characterized by curve 712, is generally referred to as the "ON" state, and a programmable crosspoint in the second resistance state operates, over the positive-volt portion of the plot, as a parallel connection of two diodes in series with a relatively low-resistance resistor, as shown in schematic 724 of FIG. 7A. The first resistance state, characterized by curve 706, is referred to as the "OFF" state, in which the programmable crosspoint behaves as a resistor with relatively high resistance, as shown by schematic 726 in FIG. 7A. At a positive applied voltage of, or greater than, $V_D^+$ 716, the programmable crosspoint may fail. Schematics 724 and 726 represent zero-order equivalent circuits of certain programmable crosspoint switches and may not be accurate physical representations of the conduction mechanism. For example, diode like nonlinearity may be due to a Schottky barrier, a thin-tunnel barrier, diffusion barriers, or Frenkel-Poole conduction, or any combination of these effects, as well other physical phenomena or characteristics. The switching polarity may differ. For example, the polarity may be opposite from that shown in FIG. 7. Furthermore, the devices may be unipolar rather than bipolar.

When the programmable crosspoint is in the second, or ON, resistance state, and when an applied voltage with negative polarity increases in magnitude up to the negative applied voltage $V_S^-$ 720, the state of the programmable crosspoint changes, at applied voltage $V_S^-$, as indicated by dashed arrow 728,, from the ON state to the OFF state. Similarly, when the programmable crosspoint is in the OFF state, and voltage increases to $V_S^+$ 708, the programmable crosspoint transitions from the OFF state to the ON state, as indicated by dashed arrow 729. A programmable crosspoint is thus a bistable device, with two states that may represent binary zero and binary one. Either of two different conventions can be applied. In the following discussion, a convention in which the ON state represents Boolean value "1" and the OFF state represents Boolean value "0" is used.

FIG. 7A is replotted, in FIG. 7B, with straight-line-segmented curves to clearly illustrate the general behavior of a programmable crosspoint. In the following discussion, when the polarity of applied voltage is significant, the polarity is shown in superscripts for voltages, such as $V_T^-$ and $V_S^+$, with the "+" superscript indicating a first polarity and the "−" superscript indicating a second, opposite polarity. However, when only the magnitude of the applied voltage is of significance, the "+" and "−" superscripts are omitted. Thus, an applied voltage magnitude $V_A > V_T$ means that $V_A$ is a positively applied voltage greater than $V_T^+$ or a negatively applied voltage less than $V_T^-$.

The current versus voltage curve, shown in FIG. 7B, for a programmable crosspoint clearly shows five different voltage regions $S^-$ 730, $R^-$ 732, H 734, $R^+$ 736, and $S^+$ 738. When a voltage in the voltage region $S^-$ 730 is applied to a programmable crosspoint, the programmable crosspoint is set to the OFF state. Similarly, when a voltage within the voltage range $S^+$ 738 is applied to a programmable crosspoint, the programmable crosspoint transitions to the ON state. The "S" designation for these regions indicates that they describe voltages for setting the state of a programmable crosspoint. When voltages, either negative or positive, are applied to the programmable crosspoint of magnitude in the range presented by the voltage ranges $R^-$ 732 and $R^+$ 736, significant current is conducted, when the programmable crosspoint is in the ON state, but, when the programmable crosspoint is in the OFF state, little current is conducted. The "R" in the designation for these voltage ranges stands for "READ." The state of a device can be read by applying READ voltages and determining whether or not the programmable crosspoint is conductive by measuring the current passing through the programmable crosspoint. READ voltages do not result in state transitions. Applied voltages in the voltage range H 734 neither result in state transitions nor in conductance of current through the programmable crosspoint. At applied voltages in the voltage range H, the programmable crosspoint acts as a resistor with relatively large resistance. As discussed below, two target programmable crosspoints on a particular nanowire, separated by intervening programmable crosspoints, can be read, set, or used as operands in a logic operation without changing the states of the intervening programmable crosspoints or of any other programmable crosspoint interconnected with the particular nanowire by ensuring that a voltage with the voltage region of H is maintained across all but the target nanowires. This is a more restrictive constraint than necessary, and be relaxed in those cases when the read, set, or logic operation does not produce a voltage in the S regions across programmable crosspoints other than the target programmable crosspoints.

Figure 8:
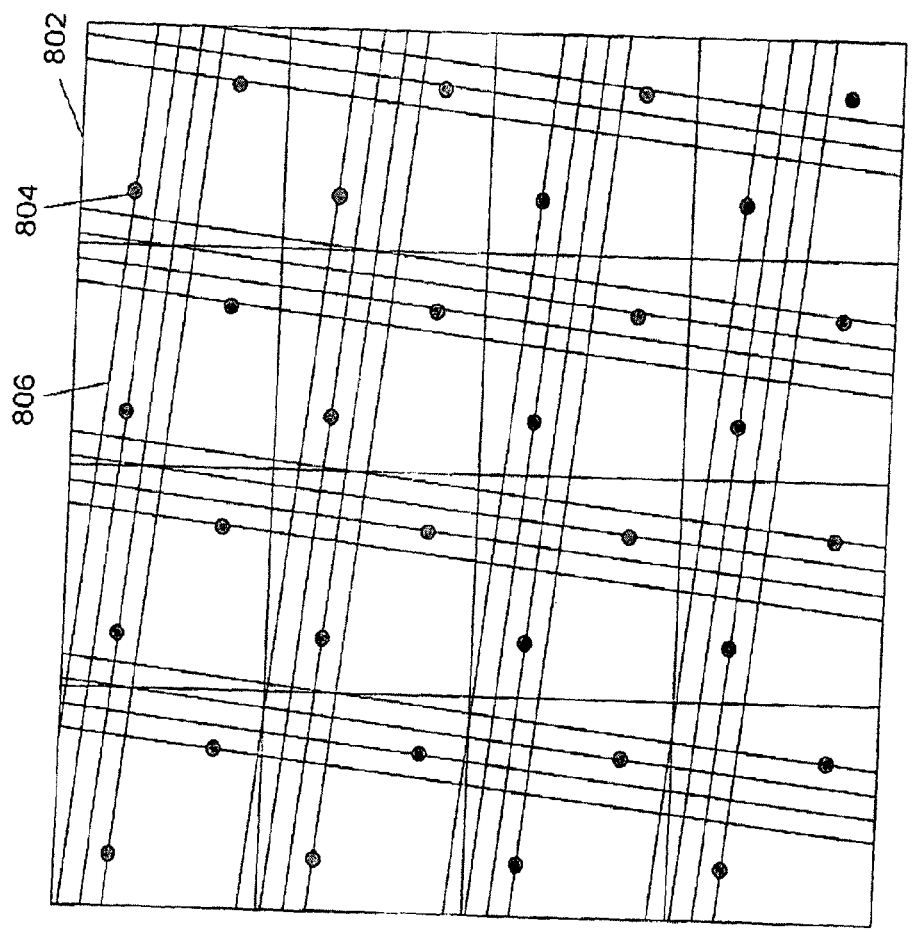
FIG. 8 shows a portion of a tessellated nanowire layer within a hybrid-nanoscale/microscale device that represents one embodiment of the present invention.

FIG. 8 shows a portion of a tessellated nanowire layer within a hybrid-nanoscale/microscale device that represents one embodiment of the present invention. In FIG. 8, the PINU structures are replaced with nanowires. While PINU structures may facilitate manufacture of tessellated nanowire layers by non-photolithographic techniques, in which alignment of pads with microscale pins is more easily automated than aligning nanowires with microscale pins, nanowires without pads can be created in alignment with microscale-layer pins using EUV photolithography or EUV interference photolithography. FIG. 8 can also be considered to represent an abstract illustration of a tessellated nanowire layer, even in the case that PINU structures are employed, with the pad omitted for clarity of illustration. Thus, for the purposes of describing the present invention, either PINU structures, straight nanowires, or other nanowire-like elements can be used, when layered as shown in FIG. 8. The illustration conventions used in FIG. 8 are used in subsequent figures. The underlying microscale or submicroscale cells are indicated by a rectilinear grid 802 in FIG. 8, which is omitted in subsequent figures. The interconnections between microscale pins and nanowires are represented by filled disks, such as filled disk 804. The oriented PINUs or straight nanowires are represented by lines, such as line 806, rotated with respect to the horizontal and vertical edges of the microscale-cell grid 802.

Figure 9:
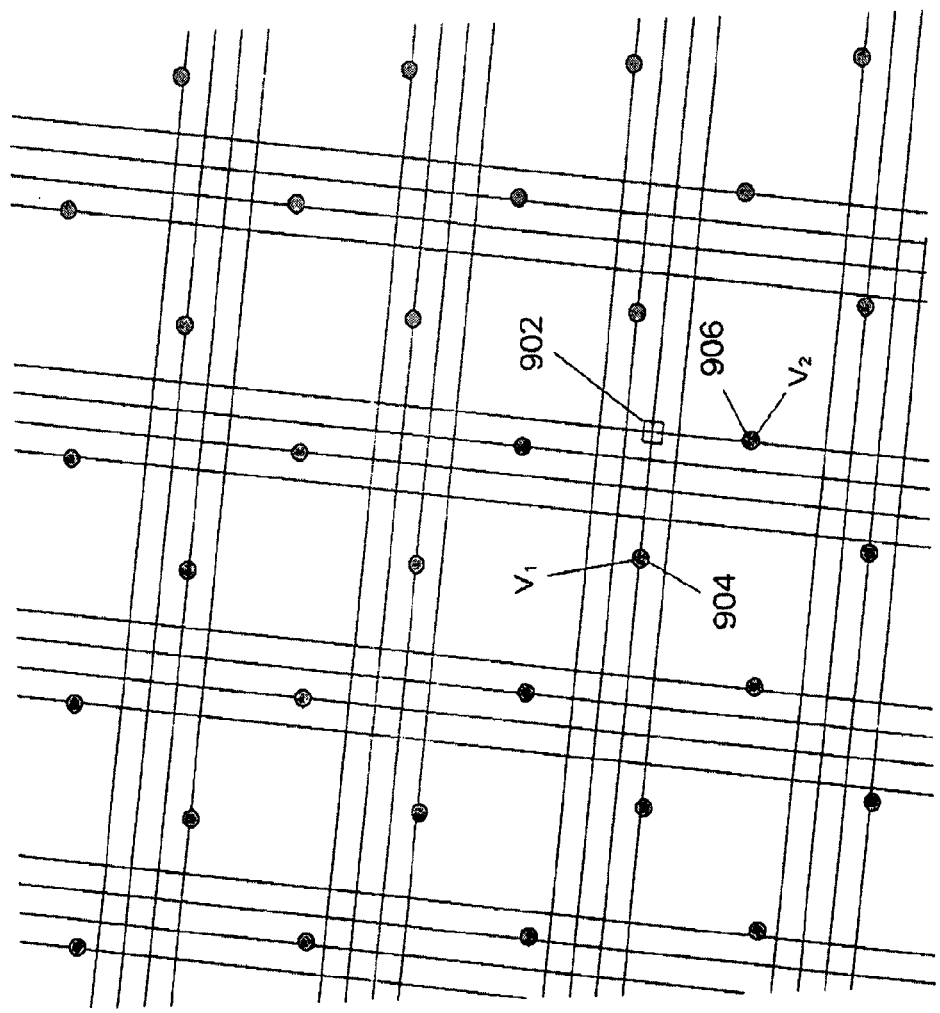
FIG. 9 illustrates how a bit is stored in an arbitrary programmable crosspoint within a tessellated nanoscale layer of a hybrid-nanoscale/microscale device according to the present invention.

FIG. 9 illustrates how a bit is stored in an arbitrary programmable crosspoint within a tessellated nanoscale layer of a hybrid-nanoscale/microscale device according to the present invention. In FIG. 9, programmable crosspoint 902 is selected to be set to a particular value, either binary "0" or binary "1." In order to the set the value of programmable crosspoint 902, two different voltages $V_1$ and $V_2$ are applied to the nanowires that intersect to form the programmable crosspoint. In FIG. 9, and in subsequent figures, a positive polarity is applied when $V_2$ is greater than $V_1$ or in other words, when the voltage applied to approximately vertical nanowires is greater than the voltage applied to approximately horizontal nanowires. In order to set the state of programmable crosspoint 902, the following constraints need to be met:

$$V_D \geq V_2 - V_1 \geq V_S \text{ for programmable crosspoint 902;}$$
and for all other affected programmable crosspoints n, $$V_n - V_2 < V_S \text{ and } V_n - V_1 < V_S$$

When $V_2 - V_1$ is positive, the programmable crosspoint 902 is set to Boolean value "1," and when $V_2 - V_1$ is negative, the programmable crosspoint is set to Boolean value "0." The other programmable crosspoints in FIG. 9 may be affected by the voltages applied to pins 904 and 906. In order that the states of other programmable crosspoints are not inadvertently affected when setting the state of programmable crosspoint 902, voltages applied to the other microscale pins, $V_n$, are of magnitude and polarity such that $|V_n-V_1|$ and $|V_n-V_2|<V_S$. Thus, by applying an appropriate voltage to the programmable crosspoints that may be potentially affected by application of voltage $V_1$ to microscale pin 904 and $V_2$ microscale pin 906, the applied voltage across all remaining programmable crosspoints in FIG. 9 can be maintained a magnitudes below $V_S$.

In general, both the microscale layer and the nanoscale layer of a nanoscale/microscale-hybrid device of the present invention carry out large numbers of concurrent operations, in parallel. Multiple programmable crosspoints may be set or cleared at any given point in time. Thus, at each point in time, some set of programmable crosspoints may be concurrently set, cleared, or used as operands in logic operations as long as the operations do not inadvertently interfere with one another or other logic operations or inadvertently set or clear any other programmable crosspoint that is not being set or cleared at that point in time. Again, as discussed above with reference to FIGS. 3A-E and 4, the nanowires have finite length, generally significantly shorter than the dimensions of the nanoscale layer. Therefore, the number of programmable crosspoints affected by application of a particular voltage to a particular pin is significantly less than might be assumed by the representation of the tessellated nanowire layer shown in FIG. 9. In summary, application of two different voltages to two pins may result in either setting or clearing the programmable crosspoint formed by intersection of the nanowires interconnected with the two pins. Application of voltages to pins can therefore be used to set or clear any programmable crosspoint in the tessellated nanoscale layer of a hybrid-nanoscale/microscale device of the present invention, and thus constitute programmable-crosspoint SET and CLEAR operations. The ability to set or clear selected programmable crosspoints is the basis for input of data from the microscale layer to the nanoscale layer. Each programmable crosspoint in the nanoscale layer is thus potentially a single-bit, binary data-storage device.

Figure 10:
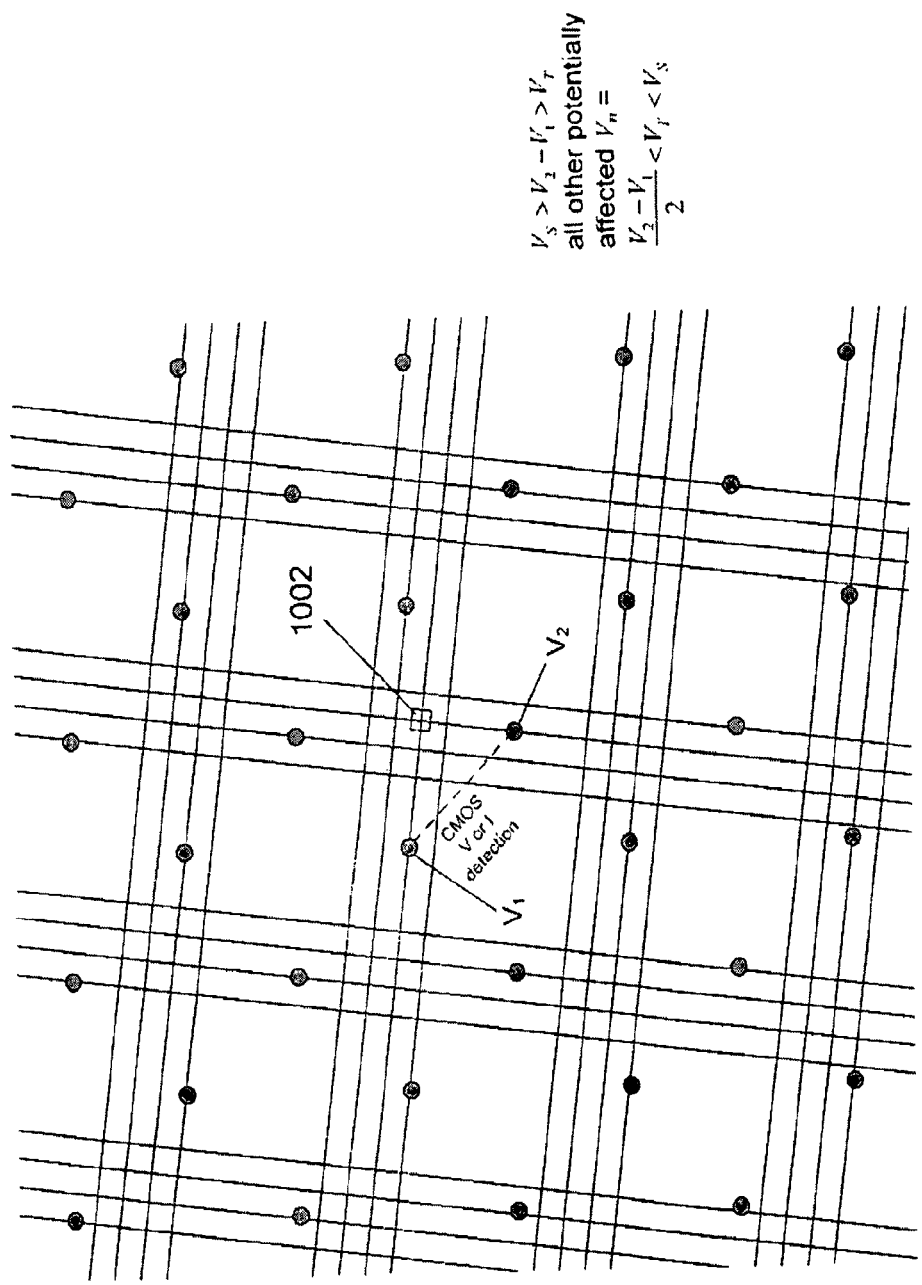
FIG. 10 illustrates a programmable-crosspoint READ operation according to one embodiment of the present invention.

FIG. 10 illustrates a programmable-crosspoint READ operation according to one embodiment of the present invention. In order to read the current resistance state of a programmable crosspoint, such as programmable crosspoint 1002 in FIG. 10, voltages are applied to pins by circuitry within the microscale layer of a hybrid-nanoscale/microscale device of the present invention. The voltages are applied to the pins interconnected with nanowires that together form the programmable crosspoint. In the case of a READ operation, the applied voltage across a programmable crosspoint must be greater than $V_T$ but less that $V_S$. In other words, the applied voltage must be within the READ regions $R^-$ and $R^+$, discussed above with reference to FIG. 7B. In this case, the programmable crosspoint will either conduct current in the case that the programmable crosspoint is in the ON state, or conduct little or no current, in the case that the programmable crosspoint is in the OFF state. Circuitry within the microscale layer connected to the microscale pins through which voltages $V_1$ and $V_2$ are applied can detect whether or not significant current is passing through the programmable crosspoint and can thus determine the state of the programmable crosspoint. Thus, for a READ operation:

$$V_S > V_2 - V_1 > V_T \text{ and}$$

for all other potentially affected for all other affected programmable crosspoints n, $$V_n - V_2 < V_T \text{ and } V_n - V_1 < V_T$$

The programmable-crosspoint READ operation, shown in FIG. 10, is the basis for data output from the nanoscale layer.

Thus, with the programmable-crosspoint SET and CLEAR operation shown in FIG. 9, and the programmable-crosspoint READ operation, shown in FIG. 10, data can be stored into, and read from, the nanoscale layer by the microscale layer, and the nanoscale layer thus becomes an extremely high-density, persistent memory that directly interfaces with the underlying microscale layer.

Figure 11A:
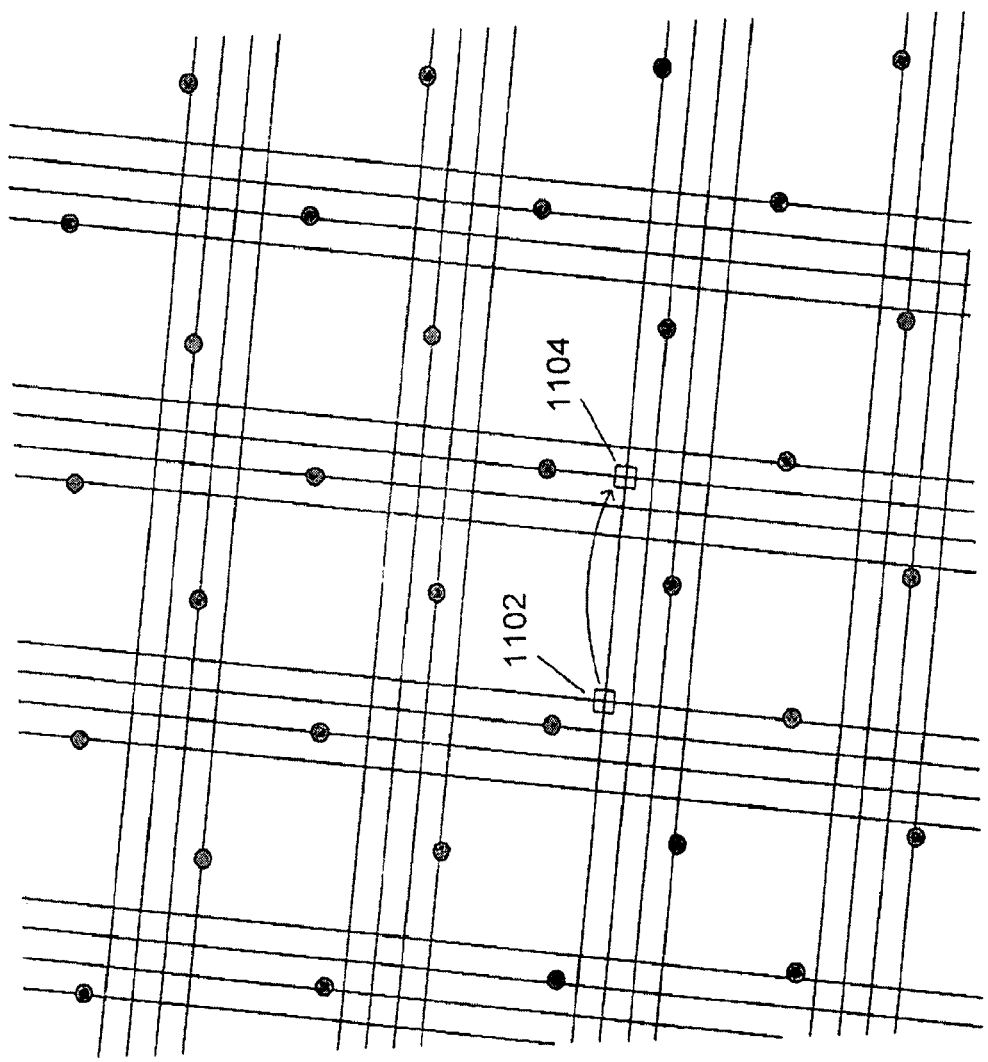
Figure 11B:
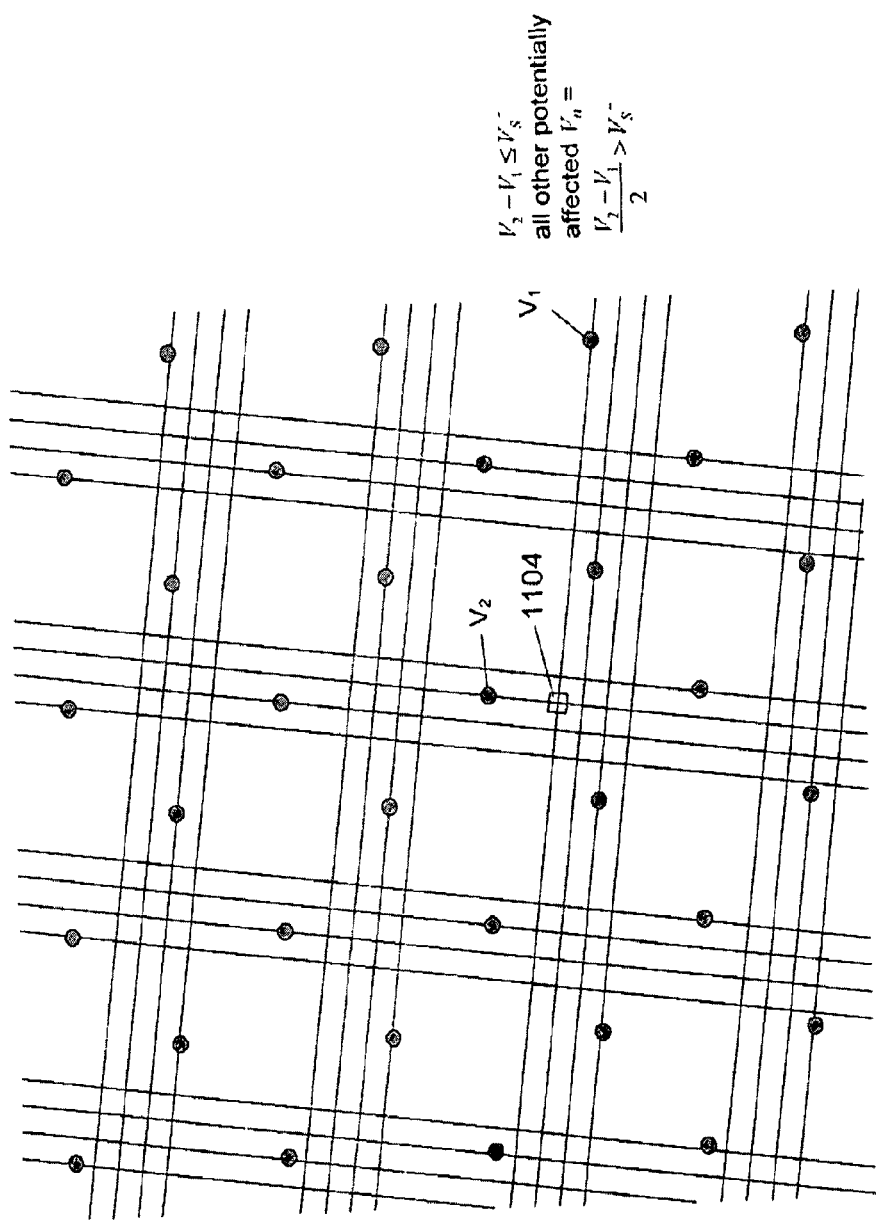

FIGS. 11A-F illustrate moving a data value from one arbitrary programmable crosspoint to another arbitrary programmable crosspoint within the nanoscale layer of a hybrid-nanoscale/microscale device that represents one embodiment of the present invention. As shown in FIG. 11A, the intent of an exemplary MOVE operation is to move whatever data value is stored in programmable crosspoint 1102 into target programmable crosspoint 1104. This is accomplished by first setting the target programmable crosspoint 1104 to Boolean value "0" or, in other words, clearing target programmable crosspoint 1104 by applying appropriate voltages $V_2$ and $V_1$ to the pins connected to the nanowires that together form the programmable crosspoint 1104 (FIG. 11B). The applied voltages are characterized as:

$$V_2 - V_1 \leq V_S^- \text{ and}$$

for all other affected programmable crosspoints n, $$V_n - V_1 < V_S \text{ and } V_n - V_2 < V_S$$

Figure 11C:
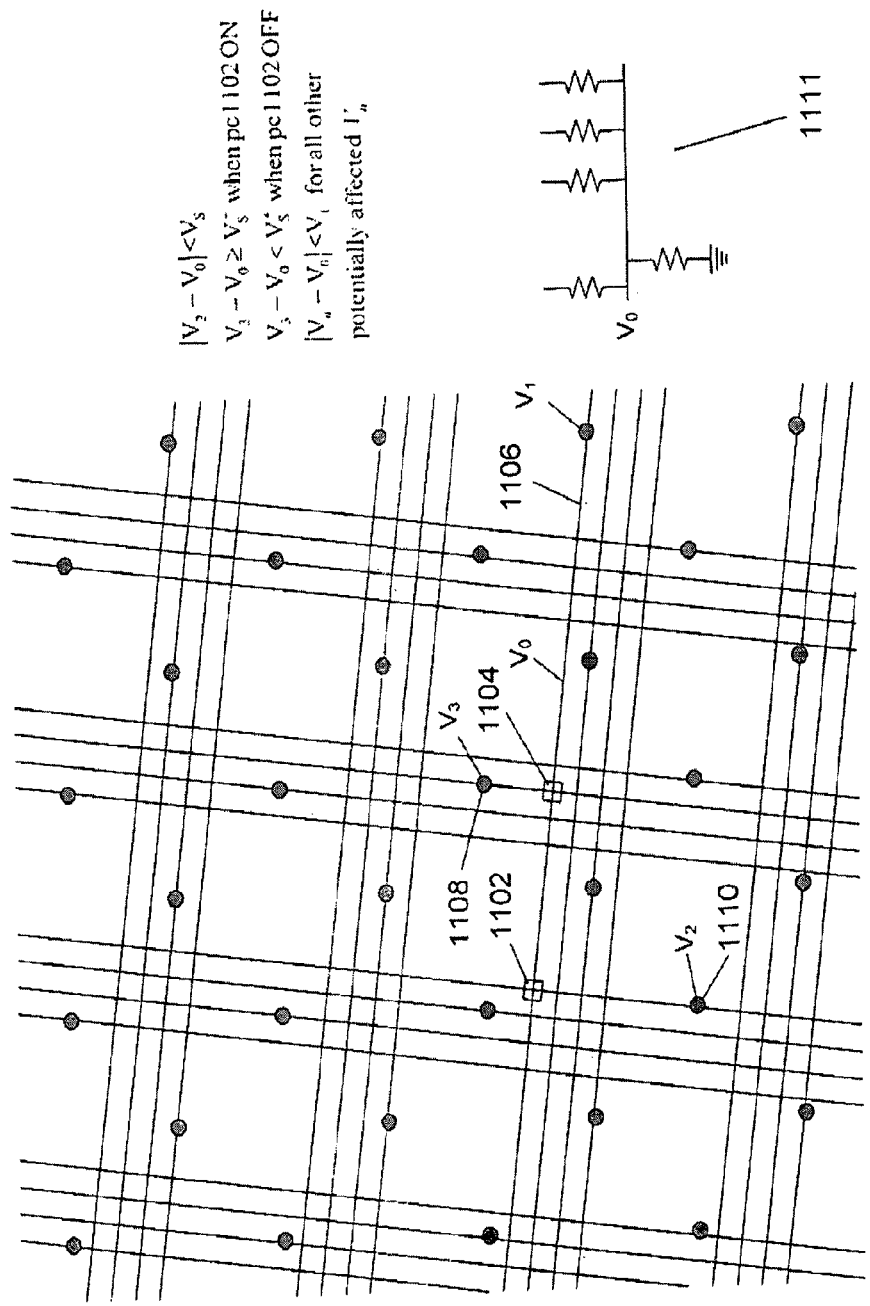

Next, as shown in FIG. 11C, the horizontal nanowire 1106 passing through both programmable crosspoints 1102 and 1104, at voltage $V_0$, is pulled to ground via some resistance R within the microscale layer, and voltage $V_3$ is applied to pin 1108 while voltage $V_2$ is applied to pin 1110. When programmable crosspoint 1102 is in the ON state, a sufficient voltage is applied across programmable crosspoint 1104 in order to set programmable crosspoint 1104 and, when programmable crosspoint 1102 is in the OFF state, insufficient voltage is applied across nanowire 1104 to set programmable crosspoint 1004. The voltage relationships are expressed as:

$$|V_2 - V_0| < V_S$$

$$V_2 - V_0 \geq V_S^+ \text{ when programmable crosspoint } \mathbf{1102} \text{ ON}$$

$$V_2 - V_0 < V_S^+ \text{ when programmable crosspoint } \mathbf{1102} \text{ OFF}$$

$$|V_n - V_0| < V_T \text{ for all other potentially affected junctions } n$$

Figure 11D:
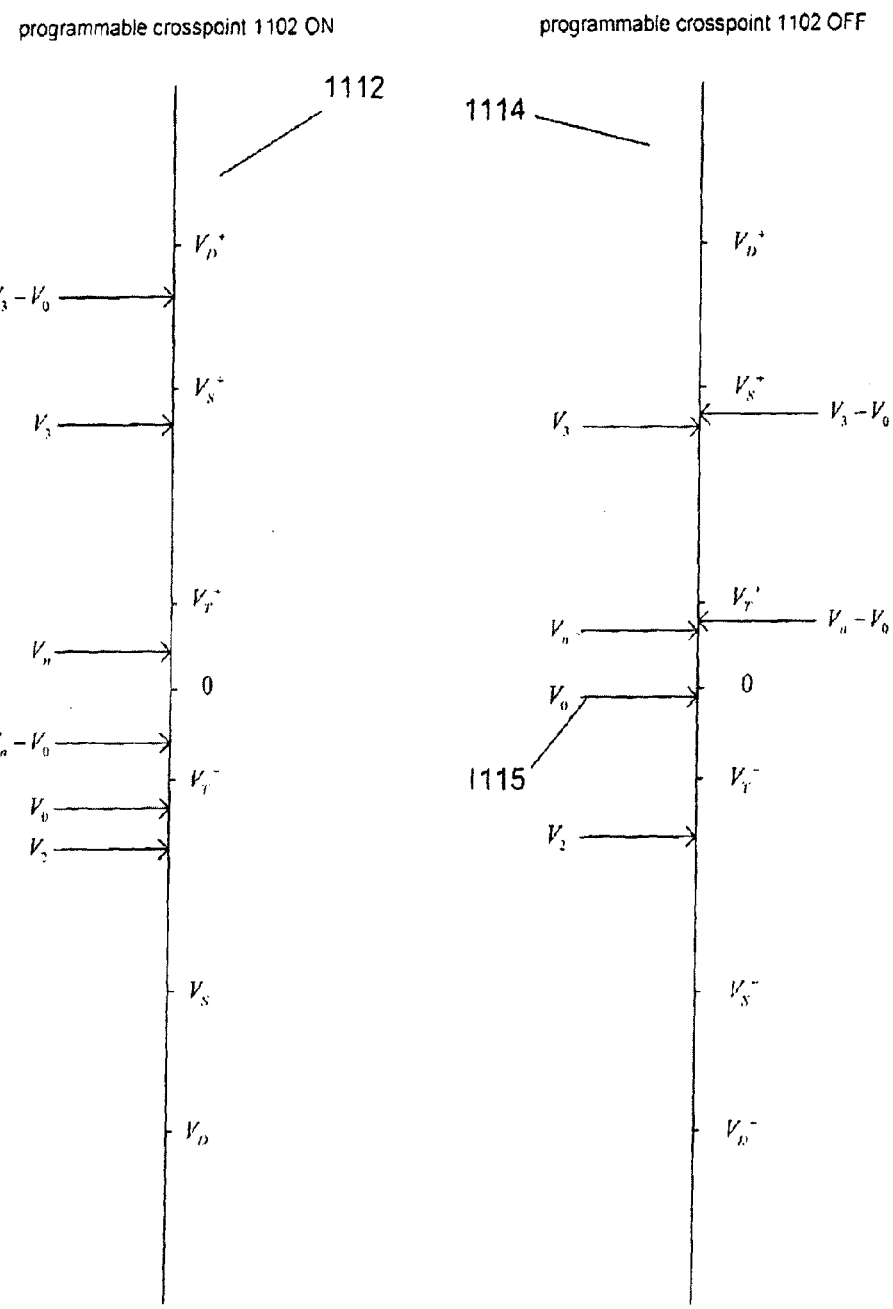

A schematic 1111 illustrating the relationships between voltages V0, $V_2$, $V_3$, and $V_n$ is provided on the right-hand side of FIG. 11C. FIG. 11D illustrates the relative magnitudes of voltages $V_3$, $V_2$, and $V_0$, applied as shown in FIG. 11C. Nanowire voltage is pulled through microscale-layer resistance R toward ground. The resistance of programmable crosspoint 1102 and the microscale-layer resistance R act as a voltage divider with horizontal nanowire 1106 acting as a tap. When the programmable crosspoint 1102 is in the ON state 1112, $V_0$ 1113 is pulled down toward V2, while, when the programmable crosspoint 1102 is in the OFF state 1114, voltage $V_0$ 1115 is pulled to nearly ground, or 0 V. Consequently, $V_3 - V_0$ is above $V_S^+$ when the programmable crosspoint 1102 is in the ON state $V_3 - V_0$ is below $V_S^+$ when the programmable crosspoint 1102 is in the OFF state. Therefore, programmable crosspoint 1104 is set to the ON state when the programmable crosspoint 1102 is in the ON state, and set to the OFF state when the programmable crosspoint 1102 is in the OFF state. It should be noted that, in practical hybrid-nanoscale/microscale devices, although the applied voltages have the same relative magnitudes as shown in FIG. 11D, spacing of the absolute values of the magnitudes may differ, in order to optimize all operations within the device. It is desirable that the voltages applied to set programmable crosspoints have a sufficient magnitude to result in a high confidence that the programmable crosspoint is set, but that other non-target programmable crosspoints within the nanoscale layer are not inadvertently set or cleared as a result of voltages applied in order to carry out particular SET, CLEAR, or logic operations on particular programmable crosspoints.

FIGS. 11E and 11F illustrate the voltage applied to programmable crosspoint 1104 when programmable crosspoint 1102 has Boolean value "1," in FIG. 11E, and when programmable crosspoint 1102 has Boolean value "0," in FIG. 11F. The voltage applied to programmable crosspoint 1104 is sufficient to set programmable crosspoint 1104, in FIG. 11E, but insufficient to set programmable crosspoint 1104, in FIG. 11F. Not that, in both figures, the horizontal nanowire 1106 is connected through a relatively large microscale-layer resistance R to ground 1130.

When the relative positions of voltages $V_2$ and $V_1$ shown in FIG. 11D are reversed, then, rather than moving the binary value stored in programmable crosspoint 1102 to programmable crosspoint 1104, the operation results in moving the inverse of the data value stored in nanowire 1102 to programmable crosspoint 1104. In other words, by interchanging the relative magnitudes of voltages $V_2$ and $V_1$ for the operation shown in FIG. 11C, the value stored in programmable crosspoint 1102 is inverted and moved to programmable crosspoint 1104. Thus, by the two-step operation shown in FIGS. 11A-F, one programmable crosspoint can be assigned the value of another programmable crosspoint, and when voltages $V_1$ and $V_2$ are interchanged with respect to the relative positions shown in FIG. 11D, the two-step operation assigns the opposite of the value stored in a first programmable crosspoint to a second programmable crosspoint. These are among the most basic data operations needed for general computing. Using these two-step operations, as well as the programmable-crosspoint SET and programmable-crosspoint CLEAR operations, discussed above, an arbitrary data value can be stored into, read from, and arbitrarily moved throughout the matrix of programmable crosspoints in the nanoscale layer.

As is well known in computer science, all possible combinatorial logic operations can be derived from the Boolean implication operation. Moreover, any sequential Boolean-logic operation can be implemented with Boolean implication logic since programmable crosspoints are also used to store intermediate values.

FIGS. 12A-G illustrate implementation of the Boolean IMP operation. A truth table for the IMP operation B←A IMP B is shown below, as Table 1.

TABLE 1

| A | B | A IMP B |
|---|---|---------|
| 0 | 0 | 1 |
| 0 | 1 | 1 |
| 1 | 0 | 0 |
| 1 | 1 | 1 |

Figure 12B:
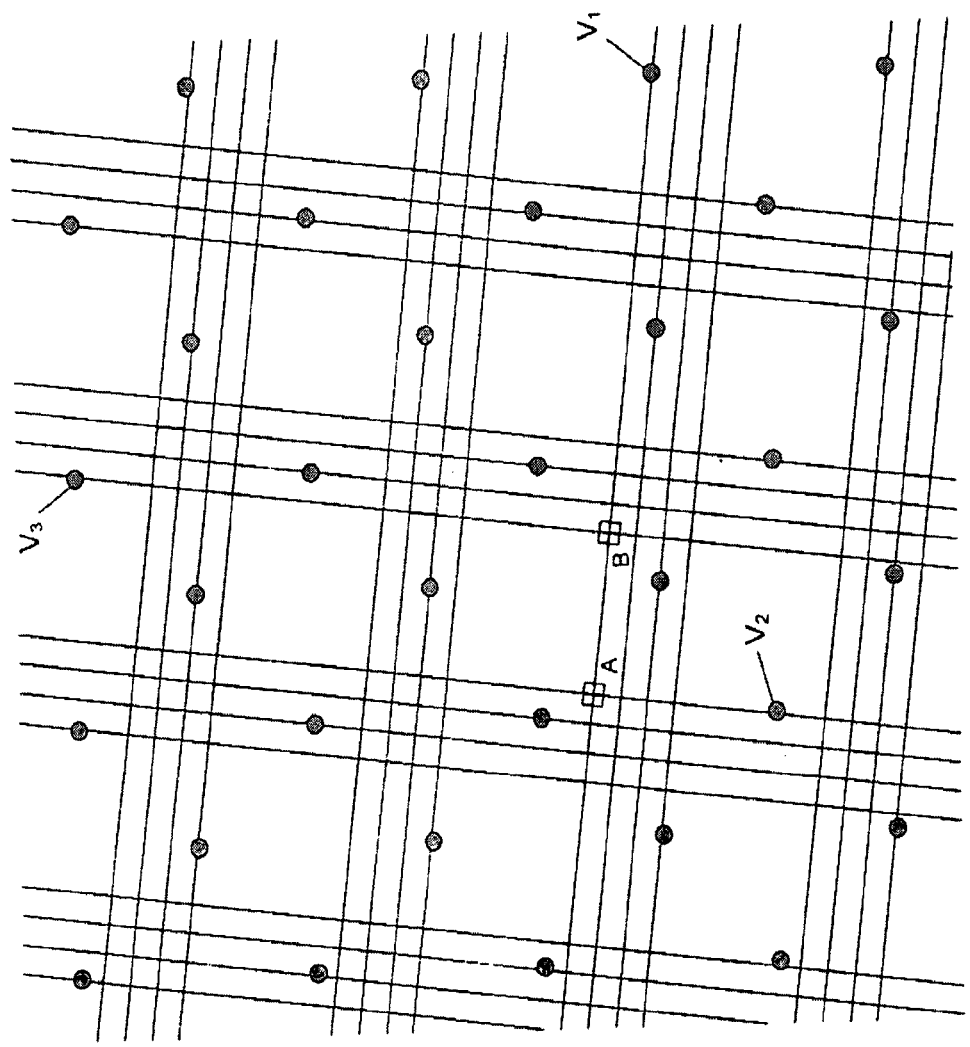
Figure 12C:
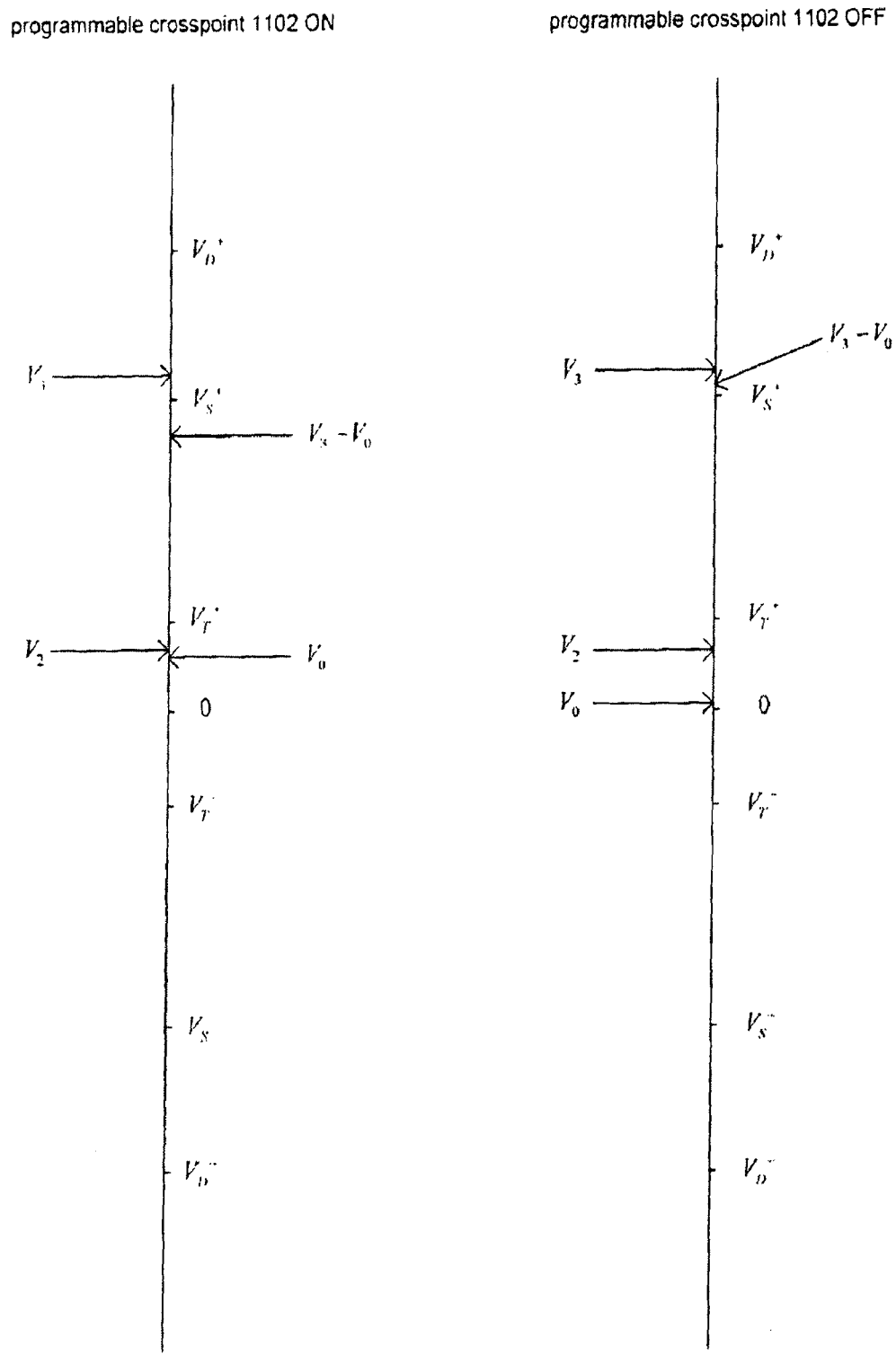

FIGS. 12A-G parallel FIGS. 11A-F, discussed above. FIG. 12A shows an exemplary IMP operation, where programmable crosspoint 1202, regarded as Boolean operand A, and programmable crosspoint 1204, regarded as Boolean operand B, are combined in an IMP operation A IMP B, with the results stored in programmable crosspoint B 1204. A single-step operation can be used to implement the IMP operation, shown in FIG. 12A. The operation employs three voltages, similar to the operation shown in FIG. 11C, with the difference that the relative voltage magnitudes differ, as shown in FIG. 12C, from the relative voltage magnitudes of the voltages applied in the MOVE operation shown in FIG. 11D.

Figure 12D:
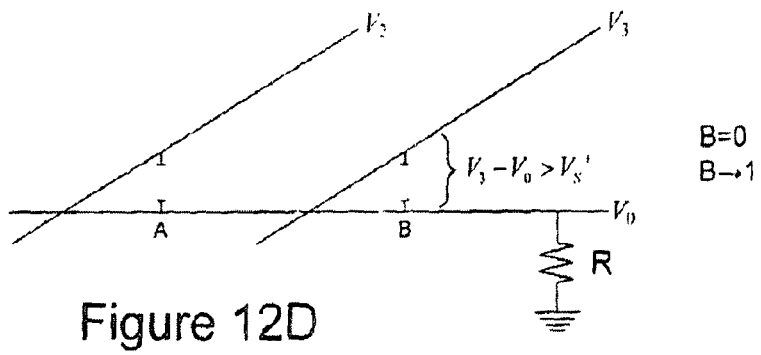
Figure 12E:
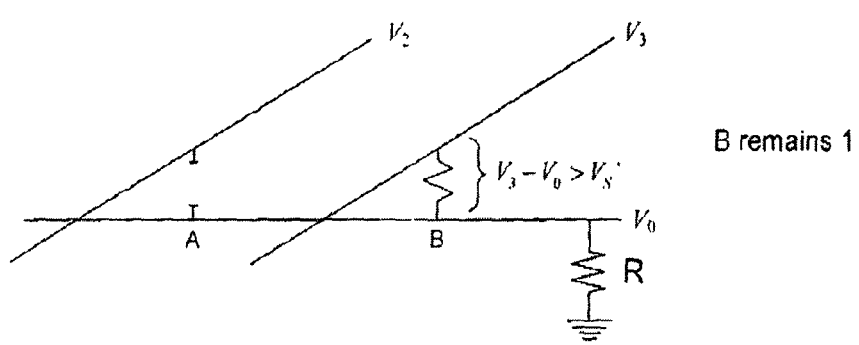
Figure 12F:
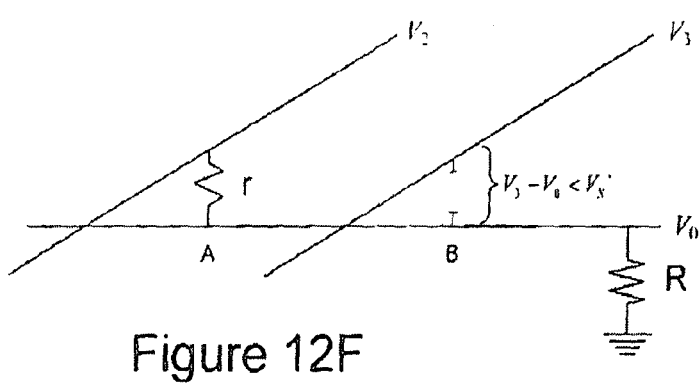
Figure 12G:
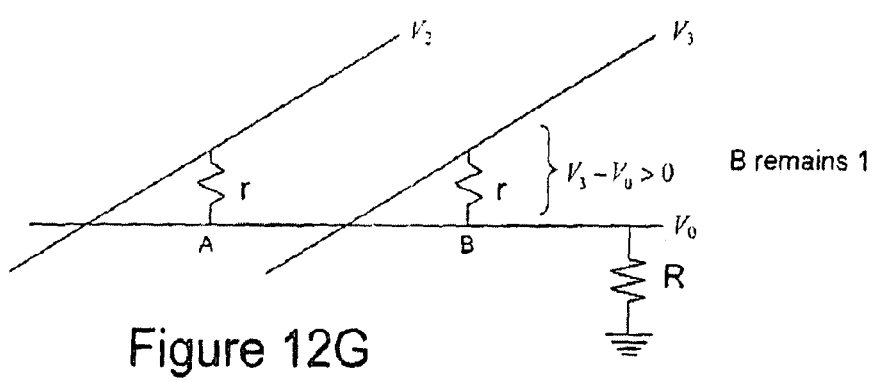

FIGS. 12D-G illustrate all four possible states of the two programmable crosspoints A and B, 1202 and 1204, respectively, prior to execution of the operation. When both programmable crosspoints are clear, as shown in FIG. 12D, a sufficient voltage is applied across programmable crosspoint B to set programmable crosspoint B. When programmable crosspoint A is clear, and programmable crosspoint B is set, as shown in FIG. 12E, then a sufficient voltage is applied across nanowire-junction B to set programmable crosspoint B. Thus, programmable crosspoint B retains its value. When programmable crosspoint A is set, and programmable crosspoint B is clear, as shown in FIG. 12F, insufficient voltage is applied across programmable crosspoint B to set programmable crosspoint B, and therefore the B retains its value. Finally, when programmable crosspoint A and programmable crosspoint B are both set, sufficient voltage is applied across programmable crosspoint B to set programmable crosspoint B, and therefore programmable crosspoint B remains set. Consideration of FIGS. 12D-12G and Table 1 reveal that, in fact, the one-step operation illustrated in FIG. 12B implements the binary IMP Boolean operation.

Figure 13A:
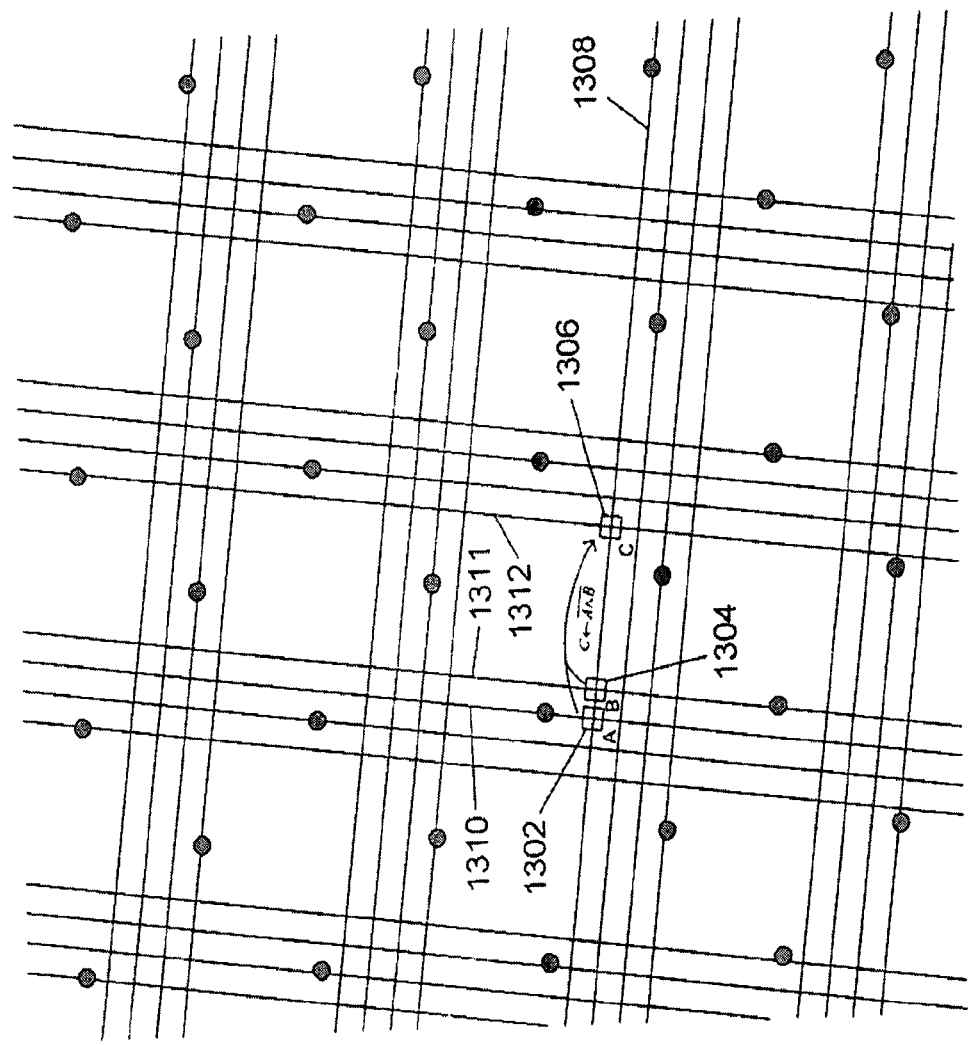
FIGS. 13A-D illustrate implementation of a Boolean NAND operation C←A NAND B.
Figure 13B:
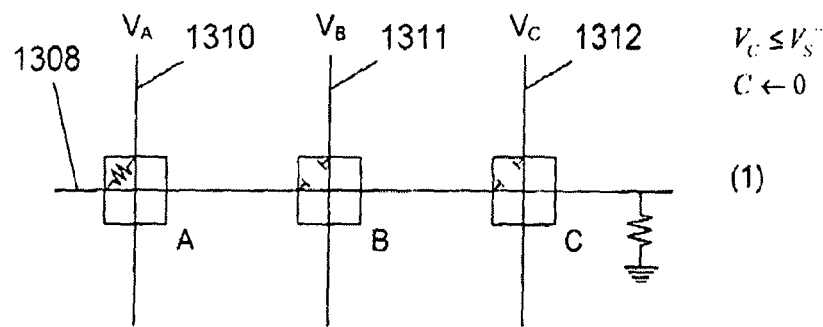
Figure 13C:
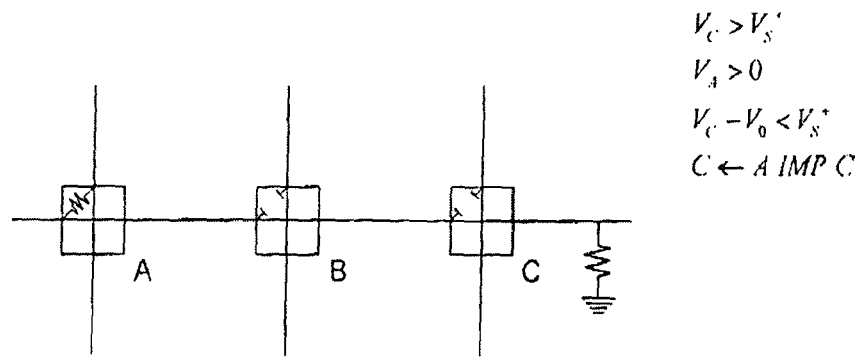
Figure 13D:
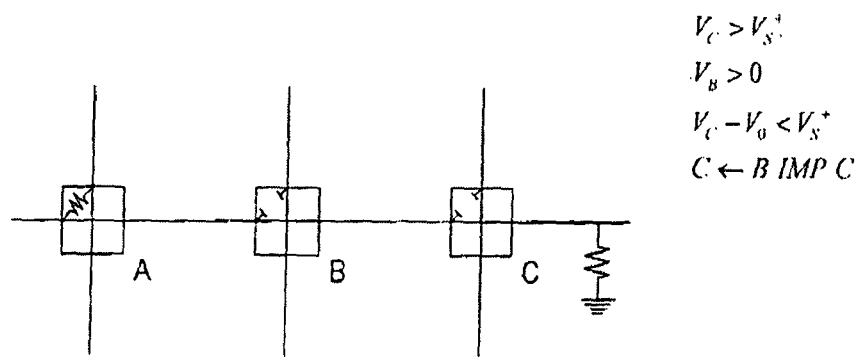

FIGS. 13A-D illustrate a Boolean implementation of a Boolean NAND operation C□A NAND B. In FIG. 13A, programmable crosspoint 1302 is NANDed with programmable crosspoint 1304 and the result is placed in programmable crosspoint 1306 to implement the logic operation C←$\overline{AB}$, or C□A NAND B. The NAND operation can be implemented in three steps, as shown in FIGS. 13B-D. In these figures, the three programmable crosspoints 1302, 1304, and 1306 are labeled A, B, and C, respectively, in a simplified diagram showing horizontal nanowire 1308 and the three vertical nanowires 1310-1312. In a first step, shown in FIG. 13B, programmable crosspoint C 1306 is cleared. In a second step, shown in FIG. 13C, programmable crosspoint C is assigned the value A IMP C, using the binary IMP operation discussed above with reference to FIGS. 12A-G. In a third step, shown in FIG. 13D, programmable crosspoint C is assigned the value of the binary Boolean function B IMP C, using a second application of the binary IMP operation discussed above with reference to FIGS. 12A-G. The value left in programmable crosspoint C is the value A NAND B.

Table 2, provided below, shows the results of each of the three steps shown in FIGS. 13B-D on all possible initial values of programmable crosspoints A and B. As can be seen in the final column of Table 2, the three-step operation, with each step represented by a correspondingly labeled column (1), (2), and (3), computes A NAND B, since the final value stored in programmable crosspoint C has Boolean value "0" only when both programmable crosspoints A and B initially have Boolean value "1."

TABLE 2

| A | B | (1) C | (2) C | (3) C |
|---|---|-------|-------|-------|
| 0 | 0 | 0 | 1 | 1 |
| 0 | 1 | 0 | 1 | 1 |
| 1 | 0 | 0 | 0 | 1 |
| 1 | 1 | 0 | 0 | 0 |

In the above discussion, implementations for the following operations have been disclosed for programmable-crosspoint data-storage elements, or binary-valued variables, within the nanoscale layer of a hybrid-nanoscale/microscale device that represents one embodiment of the present invention:

SET: $A \leftarrow 1$

CLEAR: $A \leftarrow 0$

MOVE: $A \leftarrow B$

NOT: $A \leftarrow \neg B$

IMP: $A \leftarrow B \text{ IMP } A$

NAND: $C \leftarrow A \text{ NAND } B$ where A, B, and C are binary-valued variables, or programmable crosspoints, and "1" and "0" represent the two binary values. As is well known in computer science, this set of assignment, move, and logic operations is more than sufficient for implementing any general computation that can be carried out on a machine within the constraints of a finite-sized memory of a size proportional to the number of programmable crosspoints in the nanoscale layer of a nanoscale-microscale-hybrid device of the present invention. Thus, as discussed above, a hybrid-nanoscale/microscale device, according to the present invention, obtains far greater memory-storage densities and far greater logic-circuitry densities, by using the nanoscale layer both for data storage and computation, than are possible using traditional microscale or submicroscale integrated circuits or by using the nanoscale/microscale interface devices, related to the currently claimed hybrid-nanoscale/microscale device, in which the nanoscale layer is used primarily for interconnection of microscale components. Furthermore, the nanoscale-layer-implemented memory is persistent and non-volatile, and the logic circuitry represented by the nanoscale layer can be dynamically restructured, even during a particular computational task. In other words, the generalized computing platform provided by the nanoscale layer is far more flexible than many currently rigid and specifically-tasked logic circuitries.

Figure 14A:
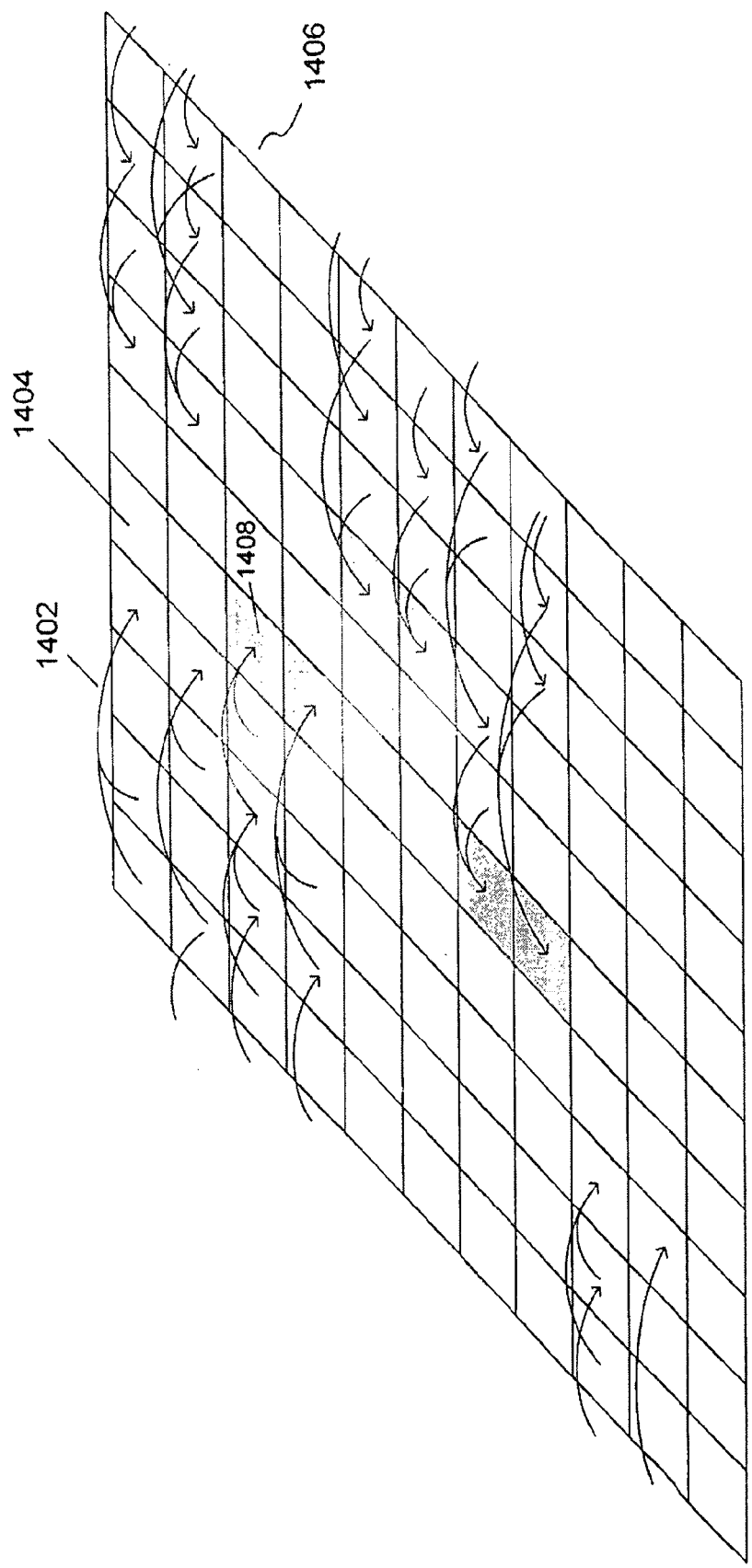
FIGS. 14A-B illustrate principles of general, parallel computing in the nanoscale layer of a hybrid-nanoscale/microscale device that represents one embodiment of the present invention.
Figure 14B:
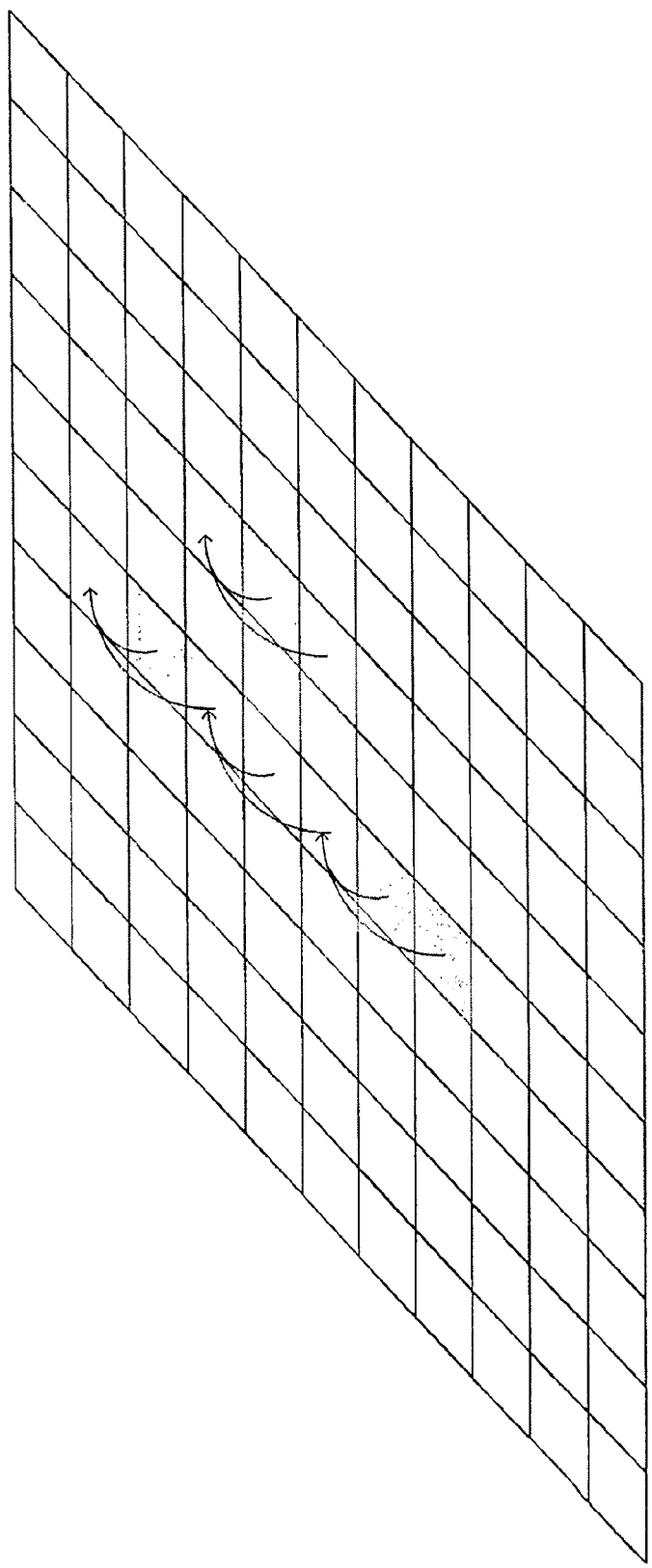

FIGS. 14A-B illustrate principles of general, parallel computing in the nanoscale layer of a hybrid-nanoscale/microscale device that represents one embodiment of the present invention. As shown by curved arrows in FIG. 14A, such as curved arrow 1402, which represent particular assignment, MOVE, and logic operations, with each cell, such as cell 1404 in the two-dimensional grid of cells 1406 representing a programmable crosspoint in a nanoscale layer of a hybrid-nanoscale/microscale device that represents an embodiment of the present invention, individual logic operations and sequences of logic operations may be carried out, in parallel, within the nanoscale layer. For example, in FIG. 14A, a large number of sequential computations are being carried out, in both rightward and leftward directions, along the horizontal rows of programmable crosspoints within the two-dimensional grid 1406. Voltages applied to the pins need to be carefully controlled, as discussed above with reference to FIGS. 9-13D, so that programmable crosspoints not involved in a computation are not inadvertently set or cleared during application of voltages to carry out assignment operations and logic operations on target programmable crosspoints, and so that the concurrent logic operations do not interfere with one another. Thus, parallel computations need to be designed, generally using automated scheduling programs, to produce intended results by careful control of voltages applied to microscale pins of the microscale layer of a hybrid-nanoscale/microscale device. Traditional circuitry in integrated-circuits operates with a large degree of parallelism, and thus the circuitry in the microscale layer can, with proper program control, control parallel execution of sequences of logic operations within the nanoscale layer. Results from a large number of parallel executions, shown in FIG. 14A to be temporarily stored in the shaded cells, such as shaded cell 1408, can be combined in subsequent move and logic operations, as shown in FIG. 14B, by changing the orientation of sequential the operations by 90°. Thus, a first set of sequences of operations produce the six results stored in shaded cells in FIG. 14A, and, in a second set of sequences of operations carried out orthogonally with respect to the first set of sequences of operations shown in FIG. 14A, the temporary results can be used together as operands for the second set of sequences of operations. In many implementations, all parallel computations may be driven in a single direction at any point in time, with the direction changing, at appropriate points in time, by 90° or 270°, in order to provide for parallel combination of results from previous sequences of execution. However, the computational and data-storage platforms provided by the nanoscale layer are quite general and flexible, and can be controlled by circuitry within the microscale to carry out arbitrary assignment and logic operations on arbitrarily selected programmable crosspoints.

Although the present invention has been described in terms of particular embodiments, it is not intended that the invention be limited to these embodiments. Modifications within the spirit of the invention will be apparent to those skilled in the art. For example, the particular geometry, number of pins per cell, number of nanowires per nanowire band, and other such parameters of a hybrid-nanoscale/microscale device of the present invention may vary, depending on design parameters, material and manufacturing-process constraints, and according to other considerations. The exact current/voltage curves for programmable crosspoints within a hybrid-nanoscale/microscale device, according to the present invention, may vary depending on the materials used to fabricate nanowires, materials used to coat fabricated nanowires, and processes employed to construct two or more layers of nanowires which together compose a nanoscale layer.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A hybrid-nanoscale/microscale device comprising:
   a microscale layer that includes microscale and/or submicroscale circuit components and that provides an array of microscale or submicroscale pins across an interface surface; and
   at least two nanoscale-layer sub-layers within a nanoscale layer that interfaces to the microscale layer, each nanoscale-layer sub-layer containing regularly spaced, parallel nanowires, each nanowire of the at least two nanoscale-layer sub-layers in electrical contact with at most one pin provided by the microscale layer, the parallel nanowires of successive nanoscale-layer sub-layers having different directions, with the nanowires of successive nanoscale-layer sub-layers intersecting to form programmable crosspoints;

wherein a programmable crosspoint of the nanoscale layer persistently stores one of two Boolean values corresponding to two different resistance states of the programmable crosspoint; and wherein signals applied to the submicroscale pins by microscale or submicroscale circuitry within the microscale layer control computational operations carried out on programmable crosspoints within the nanoscale layer.

2. The hybrid-nanoscale/microscale device of claim 1 wherein the computational operations, carried out on one or more of arbitrary programmable crosspoints A, B, and/or C, include:

setting programmable crosspoint A to Boolean value "1," A←1;

clearing programmable crosspoint A to Boolean value "0," A←0;

reading a data value stored in programmable crosspoint A, read(A);

moving a data value from programmable crosspoint A to programmable crosspoint B, B←A;

moving the inverse of a data value from programmable crosspoint A to programmable crosspoint B, B←¬A;

setting programmable crosspoint B to the result of implication of programmable crosspoint B by A, B←A IMP B; and setting programmable crosspoint C to the result of a not and of programmable crosspoints A and B, C←A NAND B.

3. The hybrid-nanoscale/microscale device of claim 2 wherein the computational operations further include a computational operation derived from two or more of:

setting programmable crosspoint A to Boolean value "1," A←1;

clearing programmable crosspoint A to Boolean value "0," A←0;

reading a data value stored in programmable crosspoint A, read(A);

moving a data value from programmable crosspoint A to programmable crosspoint B, B←A;

moving the inverse of a data value from programmable crosspoint A to programmable crosspoint B, B←¬A;

setting programmable crosspoint B to the result of implication of programmable crosspoint B by A, B←A IMP B; and setting programmable crosspoint C to the result of nand of programmable crosspoints A and B, C←A NAND B.

4. The hybrid-nanoscale/microscale device of claim 2 wherein multiple computational operations are carried out, in parallel, on binary data values stored in programmable crosspoints of the nanoscale layer.

5. The hybrid-nanoscale/microscale device of claim 4 wherein the direction, sequence, and timing of the multiple computational operations carried out, in parallel, on binary data values stored in programmable crosspoints of the nanoscale layer is controlled by microscale or submicroscale circuitry within the microscale layer.

6. The hybrid-nanoscale/microscale device of claim 1 wherein, by applying a voltage $V_1$ to a first pin and a first nanowire connected to the first pin and a voltage $V_2$ to a second pin and a second nanowire connected to the second pin, microscale or submicroscale circuitry within the microscale layer applies a voltage drop of $V_1-V_2$ across a programmable crosspoint formed at the intersection of the first and second nanowires in order to assign a Boolean value to the programmable crosspoint or read a Boolean value from the programmable crosspoint.

7. The hybrid-nanoscale/microscale device of claim 6 wherein, when the applied voltage $V_1-V_2$ exceeds a first threshold voltage, the programmable crosspoint is set to a resistance state corresponding to Boolean value "1."

8. The hybrid-nanoscale/microscale device of claim 6 wherein, when the applied voltage $V_1-V_2$ is below a second threshold voltage, the programmable crosspoint is placed in a resistance state corresponding to Boolean value "0."

9. The hybrid-nanoscale/microscale device of claim 6 wherein, when the applied voltage $V_1-V_2$ is less than a first threshold voltage magnitude and greater than a second threshold voltage magnitude, the programmable crosspoint, when in a low resistance state, conducts current that can be detected by microscale or submicroscale circuitry in the microscale layer and, when in a high resistance state, does not conduct appreciable current, which can be detected by microscale or submicroscale circuitry in the microscale layer, allowing a data value stored in the programmable crosspoint to be read by circuitry in the microscale layer.

10. The hybrid-nanoscale/microscale device of claim 1 wherein, by applying a voltage $V_1$ to a first pin and a first nanowire connected to the first pin, a voltage $V_2$ to a second pin and a second nanowire connected to the second pin, and a voltage $V_3$ to a third pin and a first nanowire connected to the first pin, microscale circuitry within the microscale layer applies a voltage drop of $V_3-V_2$ across a programmable crosspoint B formed at the intersection of the first and third nanowires when a programmable crosspoint A formed at the intersection of the first and second nanowires is in a low-resistance state and applies a voltage drop of $V_3-V_1$ across programmable crosspoint B when a programmable crosspoint A is in a high-resistance state.

11. The hybrid-nanoscale/microscale device of claim 10 wherein, when $V_3>V_2>V_1$, $V_3-V_2<$a threshold value t, and $V_3-V_1>t$, the application of voltages $V_3$, $V_2$, and $V_1$ implements B←A IMP B.

12. The hybrid-nanoscale/microscale device of claim 11 wherein, in a three-step process, when a programmable crosspoint C is cleared, when voltages are applied to next compute C←A IMP C, and when voltages are finally applied to compute C←B IMP C, the result of the three-step process is C←A NAND B.

13. The hybrid-nanoscale/microscale device of claim 10 wherein, when B is initially cleared, and $V_3>V_2>V_1$, $V_3-V_2<$a threshold value t, and $V_3-V_1>$than t, the application of voltages $V_3$, $V_2$, and $V_1$ implements B←A¬B.

14. The hybrid-nanoscale/microscale device of claim 10 wherein, when B is initially cleared, and $V_3>V_1>V_2$, $V_3-V_1<$a threshold value t, and $V_3-V_2>t$, the application of voltages $V_3$, $V_2$, and $V_1$ implements B←A.

15. The hybrid-nanoscale/microscale device of claim 1 wherein a complex computation proceeds, in parallel, over programmable crosspoints in a first direction of a programmable crosspoint array implemented in the nanoscale layer to generate a number of intermediate results stored in programmable crosspoints, and then proceeds in a second direction approximately orthogonal to the first direction, to allow the intermediate results stored in programmable crosspoints to be combined in logic operations that are carried out in the second direction.

* * * * *

UNITED STATES PATENT AND TRADEMARK OFFICE
CERTIFICATE OF CORRECTION

| | | |
|---|---|---|
| PATENT NO. | : 8,390,323 B2 | Page 1 of 1 |
| APPLICATION NO. | : 13/256234 | |
| DATED | : March 5, 2013 | |
| INVENTOR(S) | : Dmitri Borisovich Strukov et al. | |

It is certified that error appears in the above-identified patent and that said Letters Patent is hereby corrected as shown below:

In the claims

In column 20, line 49, in Claim 13, delete "than t," and insert -- t, --, therefor.

Signed and Sealed this
Twelfth Day of November, 2013

Teresa Stanek Rea
*Deputy Director of the United States Patent and Trademark Office*